(12) United States Patent
Yu et al.

(10) Patent No.: US 12,302,553 B2
(45) Date of Patent: May 13, 2025

(54) VERTICAL DRAM STRUCTURE AND METHOD

(71) Applicant: Taiwan Semiconductor Manufacturing Co., Ltd., Hsinchu (TW)

(72) Inventors: Chia-Ta Yu, New Taipei (TW); Bo-Feng Young, Taipei (TW); Hung Wei Li, Hsinchu (TW); Sai-Hooi Yeong, Zhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 415 days.

(21) Appl. No.: 17/668,770

(22) Filed: Feb. 10, 2022

(65) Prior Publication Data

US 2022/0406784 A1  Dec. 22, 2022

Related U.S. Application Data

(60) Provisional application No. 63/211,730, filed on Jun. 17, 2021.

(51) Int. Cl.
*H10B 12/00* (2023.01)
*H01L 29/10* (2006.01)

(52) U.S. Cl.
CPC ....... *H10B 12/315* (2023.02); *H01L 29/1037* (2013.01); *H10B 12/033* (2023.02); *H10B 12/48* (2023.02)

(58) Field of Classification Search
CPC .... H10B 12/315; H10B 12/033; H10B 12/48; H10B 12/05; H10B 12/482; H10B 12/30; H10B 12/02; H01L 29/1037; H01L 29/7869; H01L 29/78696
USPC ........................................................ 438/694
See application file for complete search history.

(56) References Cited

U.S. PATENT DOCUMENTS

| | | | |
|---|---|---|---|
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 2014/0008711 A1* | 1/2014 | Park ..................... | H01L 29/7827 257/296 |

(Continued)

FOREIGN PATENT DOCUMENTS

| | | |
|---|---|---|
| TW | 201606996 A | 2/2016 |
| WO | 2015199644 A1 | 12/2015 |

*Primary Examiner* — Duy Vu N Deo
(74) *Attorney, Agent, or Firm* — Slater Matsil, LLP

(57) ABSTRACT

Embodiments of the present disclosure provide a side-channel dynamic random access memory (DRAM) cell and cell array that utilizes a vertical design with side channel transistors. A dielectric layer disposed over a substrate. A gate electrode is embedded in the dielectric layer. A channel layer wraps the gate electrode and a conductive structure is adjacent to the channel layer, with the channel layer interposed between the gate electrode and the conductive structure. The semiconductor structure also includes a dielectric structure disposed over the conductive structure and the gate electrode, the channel layer extending up through the dielectric structure.

20 Claims, 37 Drawing Sheets

(56) References Cited

U.S. PATENT DOCUMENTS

| | | | |
|---|---|---|---|
| 2014/0011334 A1* | 1/2014 | Cho | H10B 99/00 |
| | | | 438/270 |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |
| 2019/0221567 A1 | 7/2019 | Sandhu | |
| 2021/0217867 A1* | 7/2021 | Ahn | H01L 29/42376 |

* cited by examiner

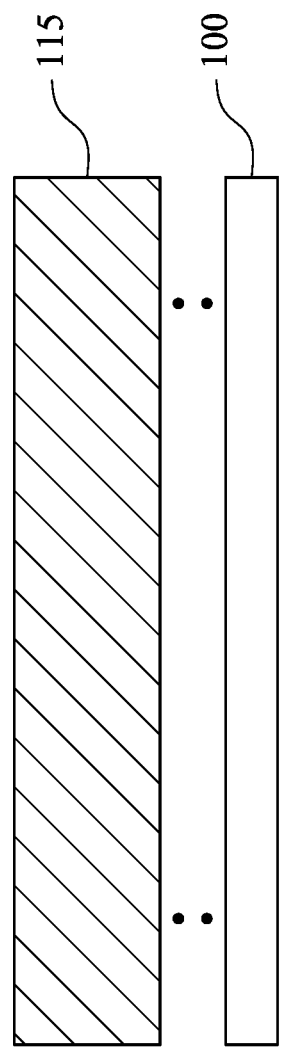

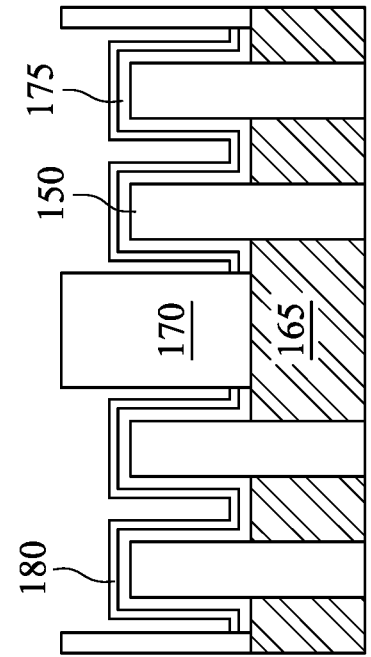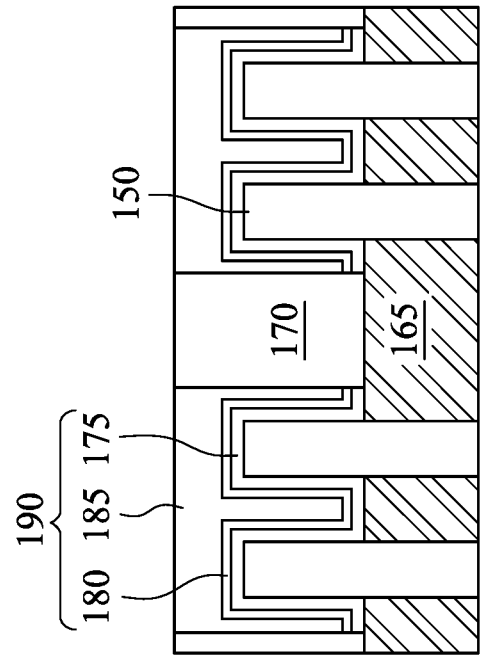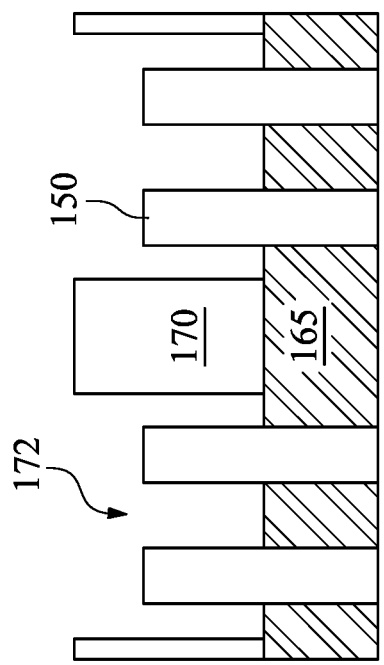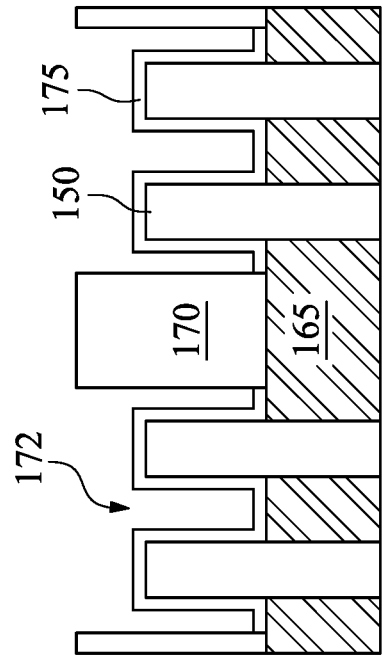
Fig. 13A
Fig. 13B
Fig. 13C
Fig. 13D

VERTICAL DRAM STRUCTURE AND METHOD

PRIORITY CLAIM AND CROSS-REFERENCE

This application claims the benefit of U.S. Provisional Application No. 63/211,730, filed on Jun. 17, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

Semiconductor memory devices include, for example, static random access memory (SRAM), and dynamic random access memory (DRAM). DRAM memory cell has only one transistor and one capacitor, so it provides a high degree of integration. Vertical DRAM provides DRAM technology in a smaller footprint, which leads to potential additional problems that need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C through FIGS. 10A, 10B, and 10C illustrate intermediate steps in the formation of a portion of a DRAM array, in accordance with some embodiments.

FIGS. 13A, 13B, 13C, and 13D are continued processes based on the structure illustrated in FIG. 8B, in accordance with other embodiments.

DETAILED DESCRIPTION

Figure 1A:
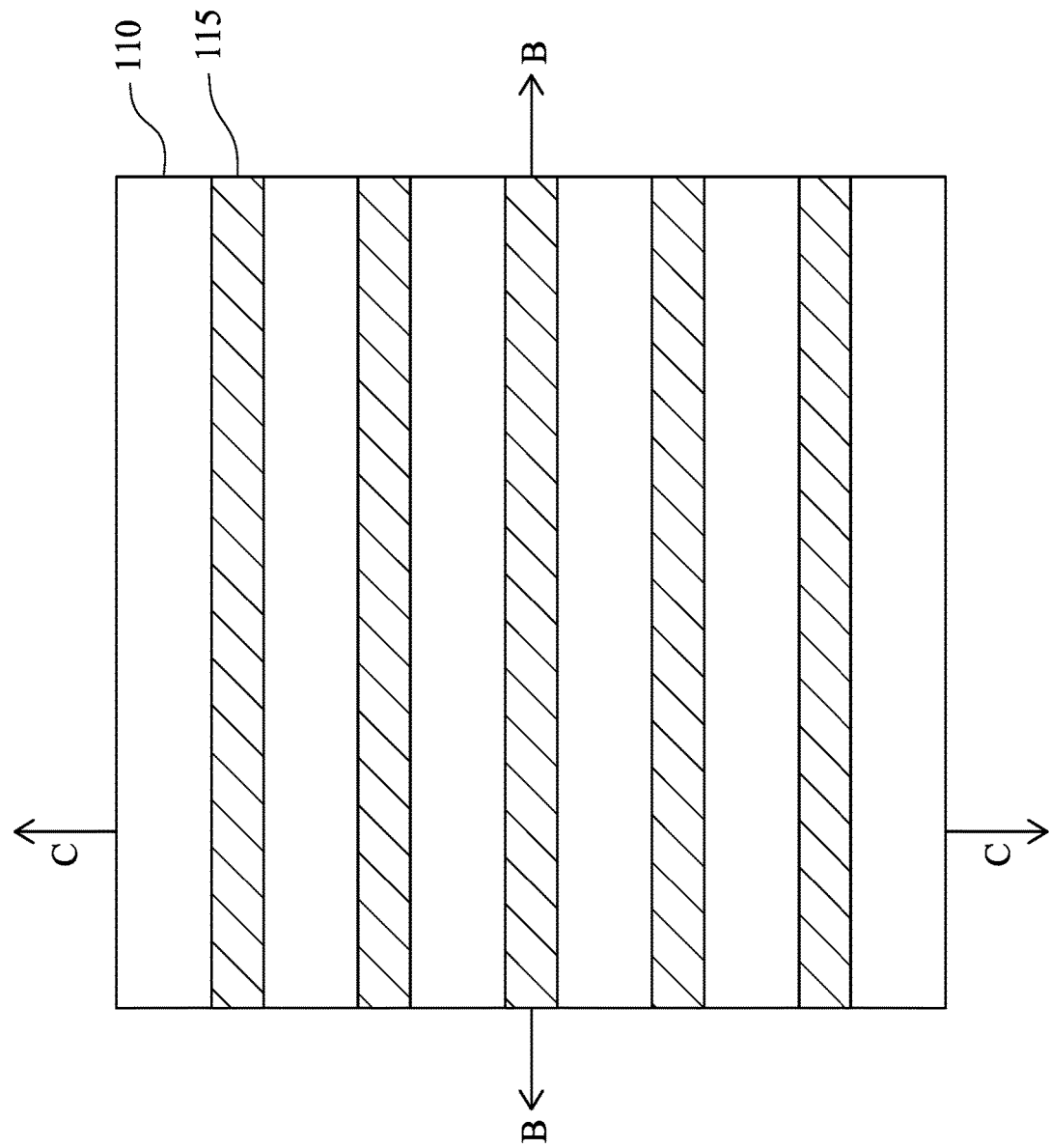

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide a side-channel dynamic random access memory (DRAM) cell and cell array that utilizes a vertical design with side channel transistors. Vertical design DRAM provides the ability to use less surface area to accomplish a memory cell and array. As the layout, however, becomes more compact, write line coupling can occur which can cause unwanted electrical performance. In addition, body effect may also be an issue, where the voltage threshold of the transistor cells is impacted by the voltage bias of the bulk material between neighboring transistors. Embodiments include a vertical DRAM design which advantageously eliminates or reduces body effect and word line (WL) coupling. Embodiments also advantageously provide good size scalability since there are no inherent size limitations for the channel and gate. As such, the restore time for the capacitor can be unaffected by scaling.

A DRAM memory cell includes a transistor, such as a field-effect transistor where the gate input is tied to a word line (WL), a first leg is tied to a bit line (BL), and a second leg is tied to a charge capacitor. The other end of the capacitor is tied to a first reference voltage, such as ground. The DRAM operates in write mode by putting a charge voltage or the first reference voltage (e.g., ground) on the BL and then enabling the WL to either charge the capacitor or drain the capacitor, thereby writing a one or zero to the capacitor, respectively. The DRAM operates in read mode by putting a second reference voltage on the BL that is between the charge voltage and the first reference voltage. Then the WL is enabled. If the BL voltage is increased because the capacitor begins to drain to the BL, then it is determined to have been a one. If the BL voltage is reduced because it begins to charge the capacitor, then it is determined to have been a zero.

FIGS. 1A, 1B, and 1C through FIGS. 10A, 10B, and 10C illustrate intermediate steps in the formation of a portion of a DRAM array, including several DRAM cells. FIGS. 1A, 2A, 3A, 4A, 5A, 6A, 7A, 8A, 9A, and 10A illustrate plan views and may include several features from several horizontal cross sections in a single view. These will be identified in the discussion below. FIGS. 1B, 2B, 3B, 4B, 5B, 6B, 7B, 8B, 9B, and 10B illustrate cross-sectional views along the B-B reference line of FIGS. 1A, 2A, 3A, 4A, 5A, 6A, 7A, 8A, 9A, and 10A, respectively (through the BL, along the length of the BL). FIGS. 1C, 2C, 3C, 4C, 5C, 6C, 7C, 8C, 9C, and 10C illustrate cross-sectional views along the C-C reference line of FIGS. 1A, 2A, 3A, 4A, 5A, 6A, 7A, 8A, 9A, and 10A respectively. FIGS. 2D and 3D illustrate cross-sectional views along the D-D reference line of FIGS. 2A and 3A, respectively. It should be understood that the processes described and illustrated herein may be replicated to any number of DRAM cells and DRAM arrays on a single substrate or device. It should also be understood that the DRAM cells and/or DRAM arrays need additional circuitry to operate, such as voltage sense devices, multiplex devices, and control devices, which are known to a person of ordinary skill.

Figure 1C:
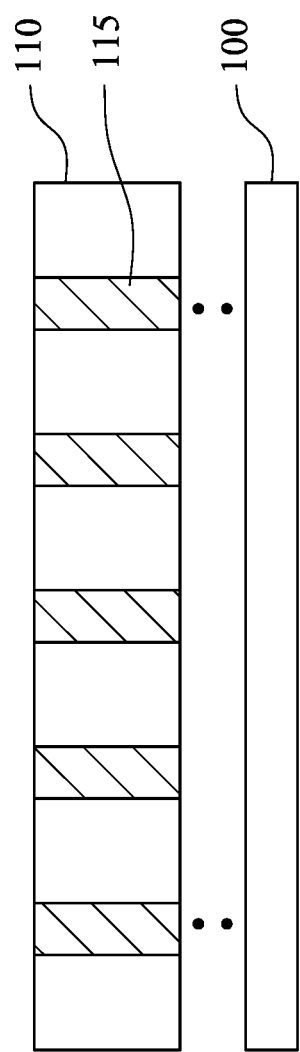

FIGS. 1A, 1B, and 1C illustrate a substrate 100 and dielectric layer 110, with any number of layers and device features interposed there between. FIG. 1A is in a plan view, FIG. 1B is a cross-sectional view along the line B-B of FIG. 1A, and FIG. 1C is a cross-sectional view along the line C-C of FIG. 1A. The substrate 100 may be a semiconductor substrate, which may be a silicon substrate, a silicon germanium substrate, or a substrate formed of other semiconductor materials. Substrate 100 may be doped with a p-type or an n-type impurity. In other embodiments, the substrate 100 may be a carrier substrate, such as a glass carrier, ceramic carrier, the like, and so forth. The dielectric layer 110 may be any suitable dielectric layer type. In some embodiments, the dielectric layer 110 may be an inter-layer dielectric (ILD) or an inter-metal dielectric (IMD), or the like, and may be a layer in a redistribution structure or interconnect. The dielectric layer 110 may include a dielectric material formed using, for example, FCVD, spin-on coating, CVD, or another deposition process. Dielectric layer 110 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like.

Next, trenches are formed in the dielectric layer 110. The trenches may be formed by a suitable photo etching process. For example, a resist layer (not illustrated) may be formed over the dielectric layer 110 and exposed to a light source through a light mask, which is then patterned onto the resist layer. Next, the resist layer is developed and cured, forming openings in the resist layer according to the pattern of the light mask. The resist layer is used as a mask for performing an etching process. The etching process may include wet and/or dry etching processes to transfer the openings of the resist layer to the underlying layer. In some embodiments, additional etch masks may be used between the resist layer and the target layer (in this case, the dielectric layer 110). In some embodiments, the etching process utilizes an isotropic etch to pattern the trenches into the dielectric layer 110.

After the trenches are formed, the BLs 115 are formed by depositing a conductive material in the trenches, for example, by depositing a seed layer, and then performing a plating process to deposit the conductive material. The conductive material of the BLs 115 may include any suitable material, such as copper, tin, tungsten, cobalt, aluminum, gold, titanium, titanium nitride, tantalum, tantalum nitride, and so forth, alloys thereof, combinations thereof, and the like. In some embodiments, a barrier layer may first be deposited to inhibit diffusion of the conductive material into the surrounding dielectric layer 110. The barrier layer may be formed of any suitable material such as titanium nitride or the like and may be deposited by CVD, PVD, ALD, or another suitable process. Then, a planarization process may be used, such as a CMP process to level the upper surfaces of the BLs 115 with the upper surface of the dielectric layer 110.

Other processes may be used to form the BLs 115 in the dielectric layer 110, including, for example, forming the BLs 115 first and then forming the dielectric layer 110 around the BLs 115, followed by a planarization process to level the upper surfaces of the BLs 115 with the upper surfaces of the dielectric layer 110.

Figure 2A:
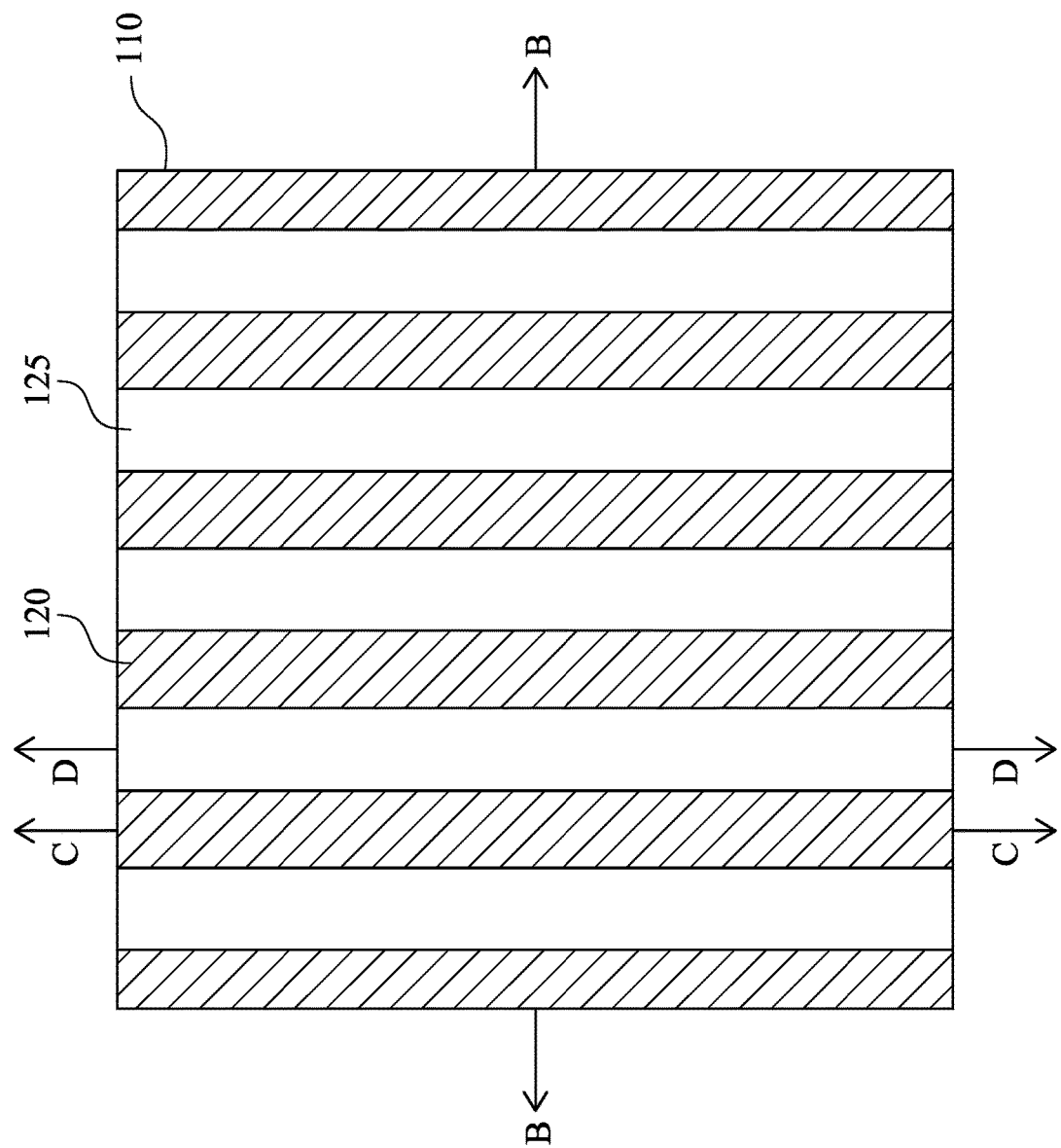
Figure 2B:
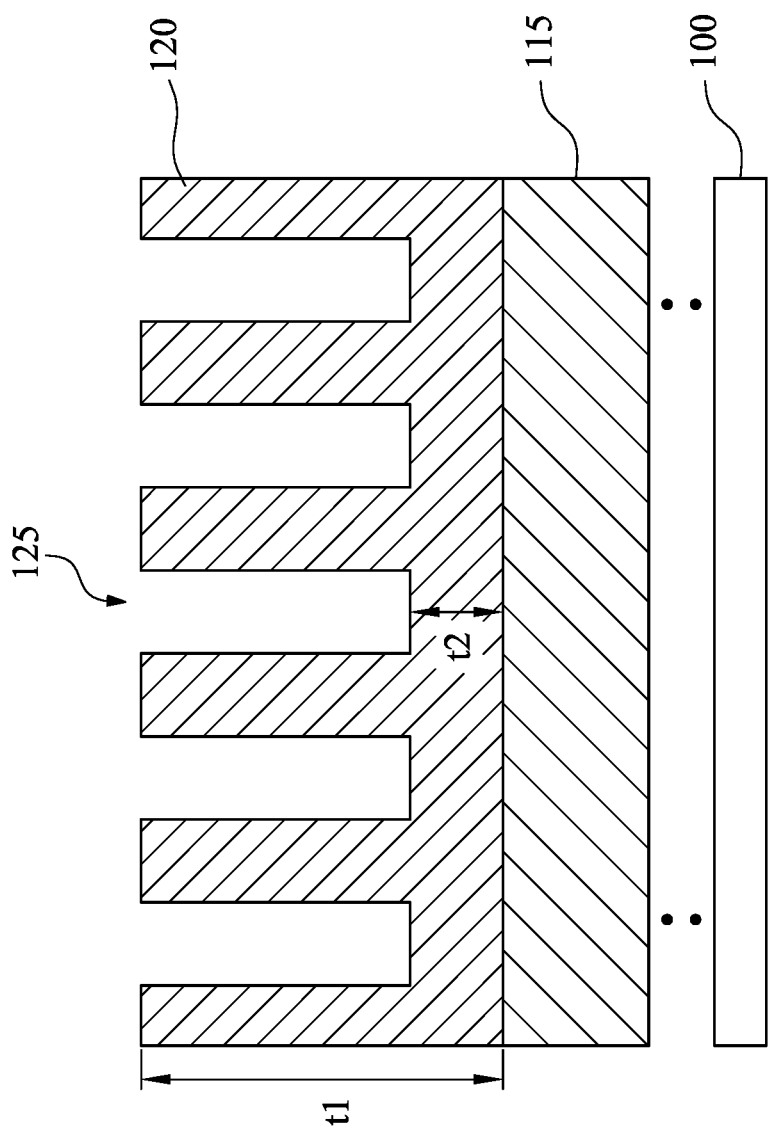
Figure 2C:
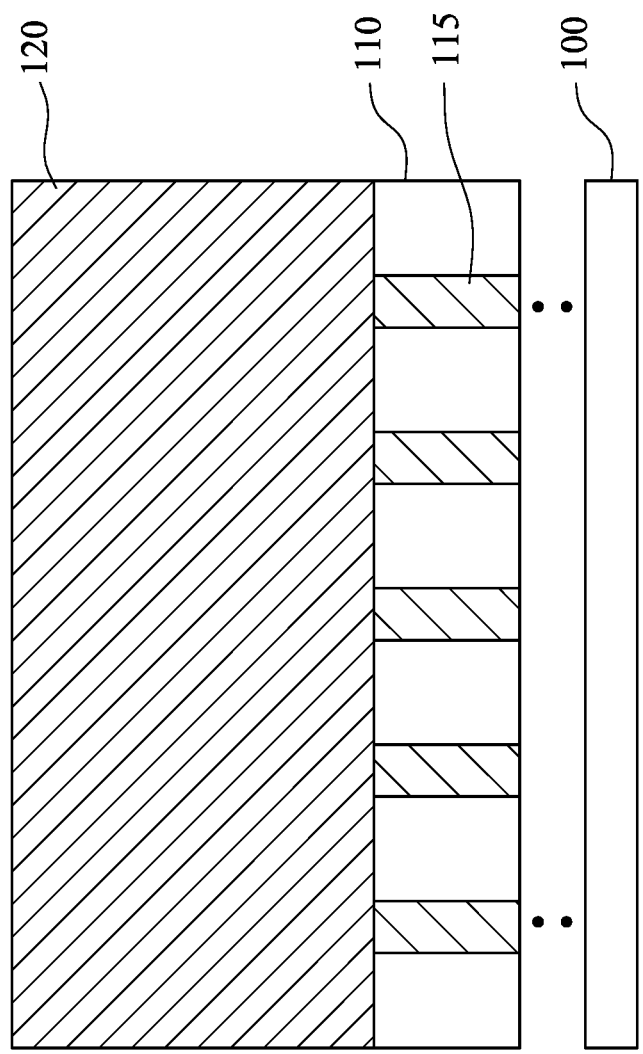
Figure 2D:
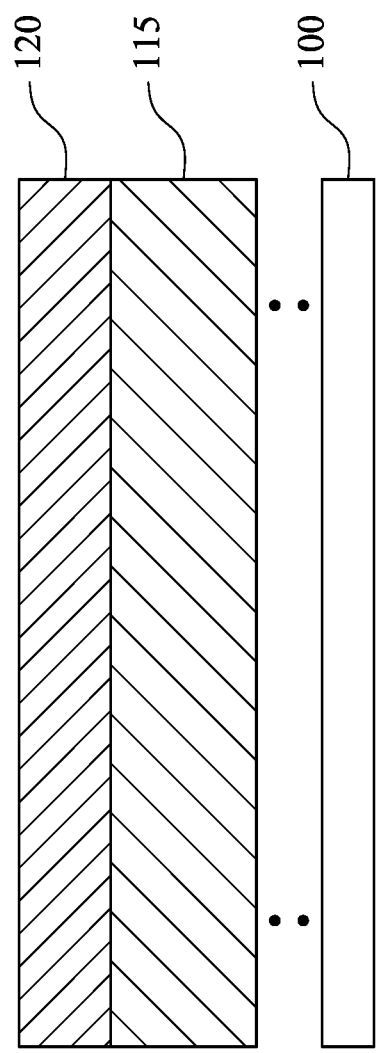

In FIGS. 2A, 2B, 2C, and 2D the dielectric layer 120 is formed and trenches are formed therein. The trenches 125 are formed so that they do not completely traverse the thickness of the dielectric layer 120. FIG. 2A is in a plan view, FIG. 2B is a cross-sectional view along the line B-B of FIG. 2A, FIG. 2C is a cross-sectional view along the line C-C of FIG. 2A, and FIG. 2D is a cross-sectional view along the line D-D of FIG. 2A.

First, the dielectric layer 120 is formed over the BLs 115 and dielectric layer 110. The dielectric layer 120 may include a dielectric material formed using, for example, FCVD, spin-on coating, CVD, or another deposition process. Dielectric layer 120 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. The thickness t1 of the dielectric layer 120 may be between about 50 nm and 5000 nm.

Next, the dielectric layer 120 is patterned to form the trenches 125. The trenches 125 run lengthwise perpendicular to the BLs 115. The view in FIG. 2A combines a view of the trenches 125 with a view of the dielectric layer 120 (omitting the bottom portion of the dielectric layer 120). The BLs 115 continue across under the trenches 125 as illustrated in FIG. 2B. The trenches 125 may be formed using any suitable photolithography and etching process, such as described above with respect to patterning the dielectric layer 110. The etching process may utilize a timed etching so that the bottom of the trenches 125 is disposed between the bottom of the dielectric layer 110 and the top of the dielectric layer 120. A ground gate will be formed in the trenches 125 and the thickness t2 of the dielectric layer 120 remaining between the BLs 115 and the bottom of the trenches 125 isolates the BLs 115 from the ground gate. In some embodiments the thickness t2 may be between about 1 nm and 50 nm. It is desired to be small in order to reduce body effect and shrink the area required for each DRAM cell. If the thickness t2 is too small, however, breakdown or leakage of the ground gate (subsequently formed in the trenches 125) to the BLs 115 may occur. In some embodiments, the target thickness t2 is determined by thicknesses of a subsequently formed gate channel and gate insulating layer, which will be further discussed below.

Figure 3A:
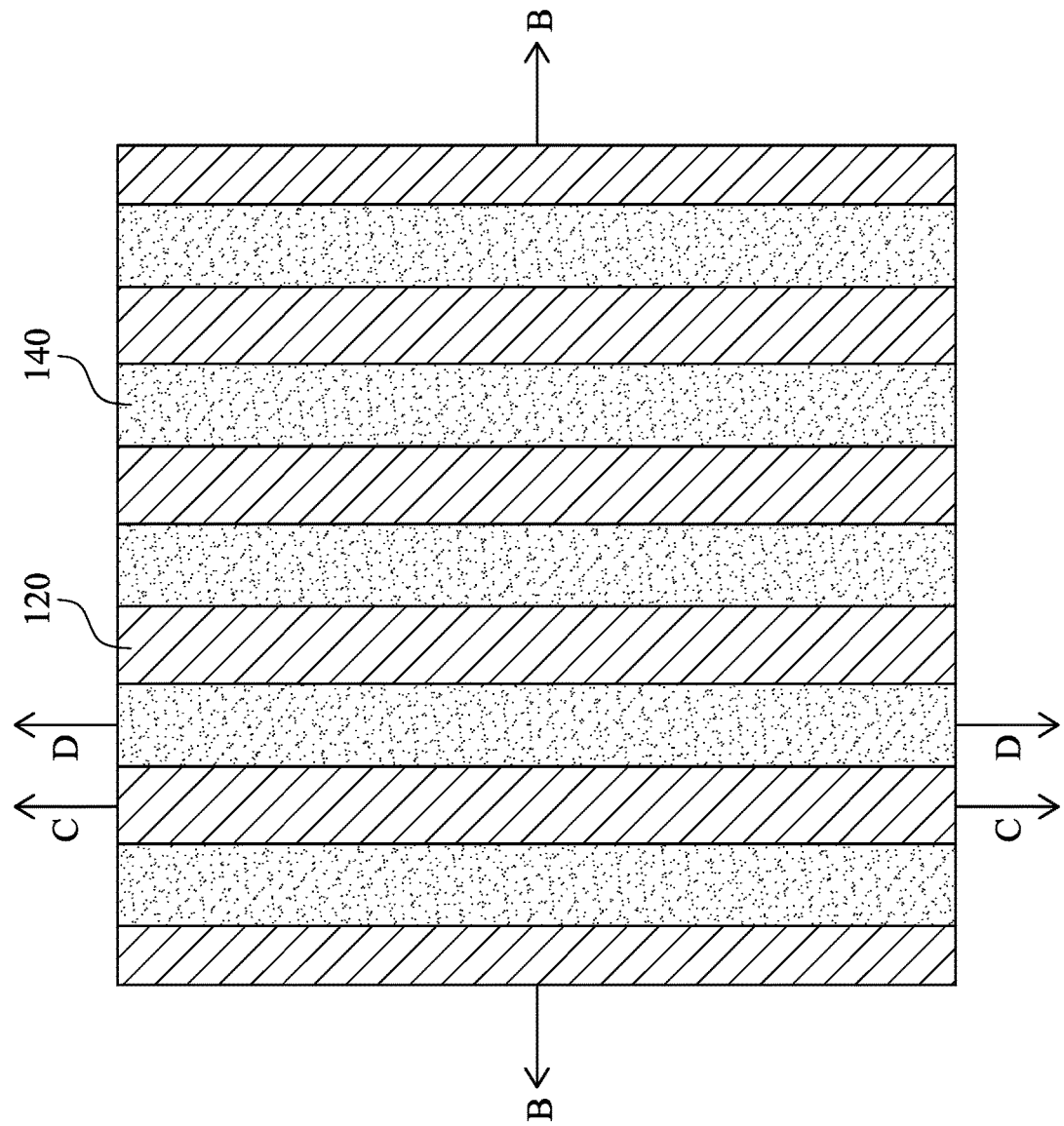
Figure 3B:
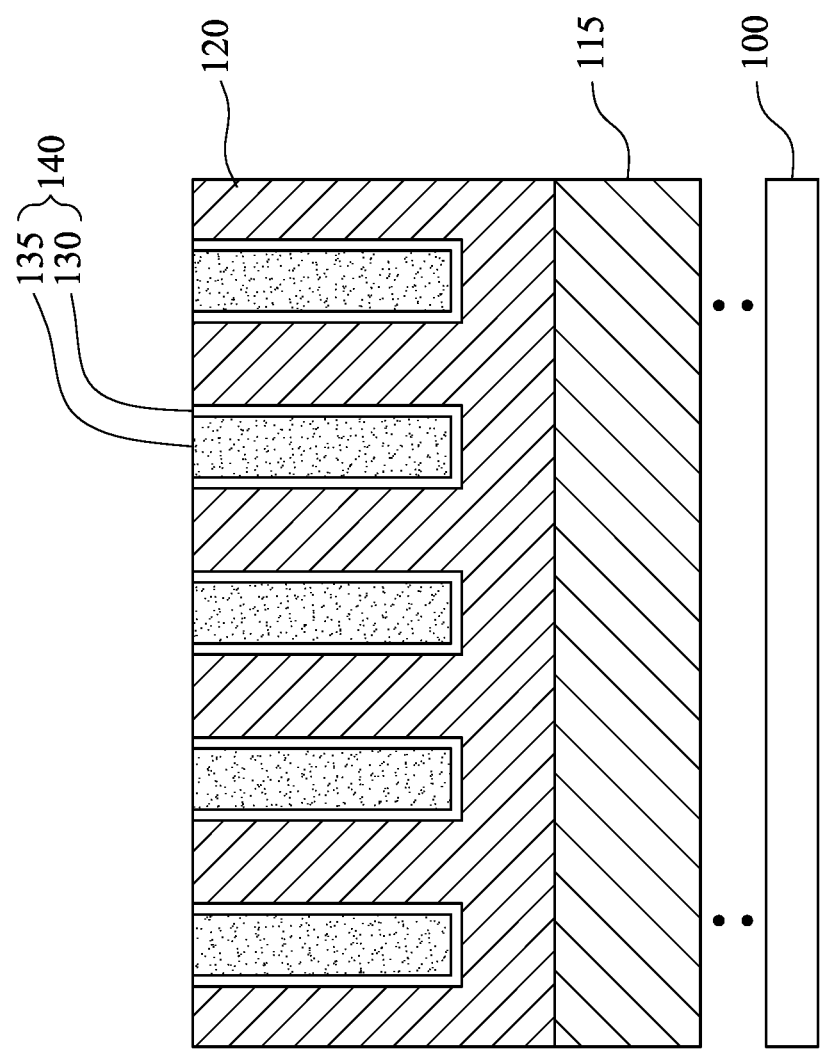
Figure 3C:
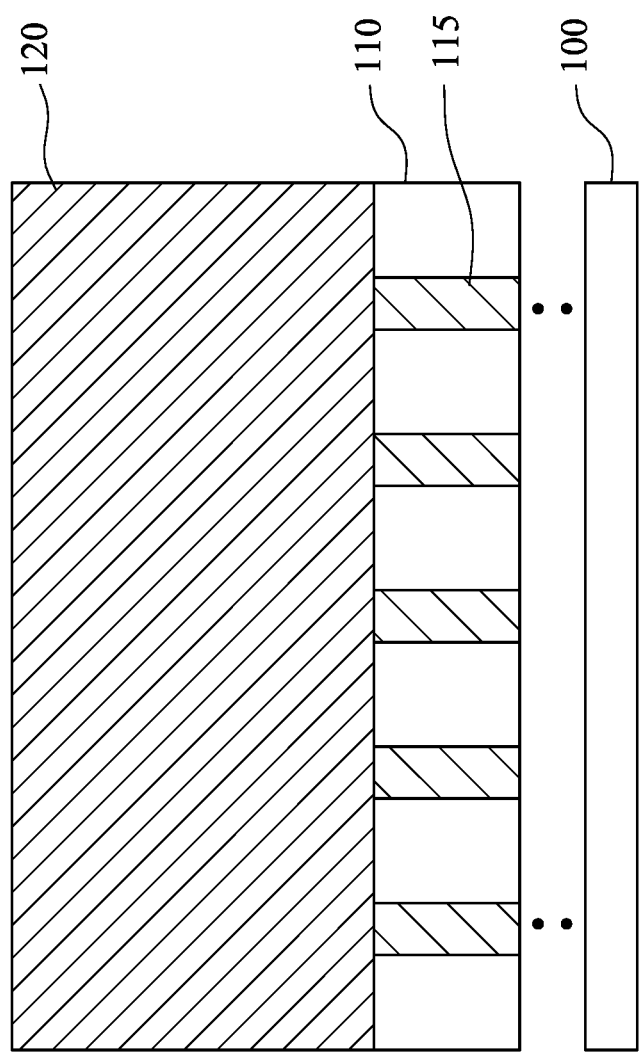
Figure 3D:
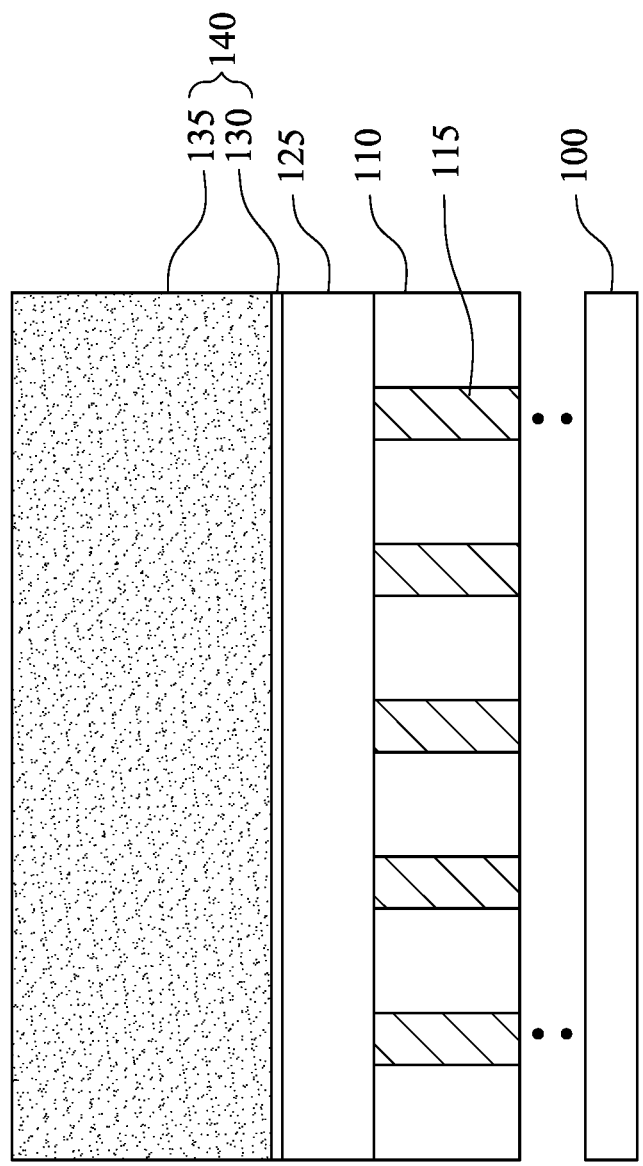

In FIGS. 3A, 3B, 3C, and 3D, the ground gates 140 are formed in the trenches 125 of a glue layer 130 and ground gate electrode 135. FIG. 3A is in a plan view, FIG. 3B is a cross-sectional view along the line B-B of FIG. 3A, FIG. 3C is a cross-sectional view along the line C-C of FIG. 3A, and FIG. 3D is a cross-sectional view along the line D-D of FIG. 3A. The BLs 115 continue across under the dielectric layer 120 as illustrated in FIG. 3B. The ground gate 140 provides a ground plane between each of the side channels and prevents or reduces coupling effects of adjacent WLs. Preventing or reducing coupling effects improves controllability of the resulting memory cell or array because a neighboring WL is prevented from influencing the adjacent WL.

The ground gate 140 also reduces the body effect by eliminating a voltage potential which otherwise might be in the dielectric or bulk material between memory transistor gates. It should be understood that although the term "ground gate" is used, the supplied potential at the ground gate 140 may be any suitable reference voltage.

The ground gates 140 are formed by first depositing a glue layer 130 in each of the trenches 125 and over an upper surface of the dielectric layer 120. The glue layer 130 may be deposited by any suitable process, such as by CVD, PVD, ALD, the like, or combinations thereof. The glue layer 130 is deposited conformally and provides stability between the subsequently formed channel and the ground gate electrode 135. The glue layer 130 may be made of any suitable material, such as titanium nitride and may or may not be doped with silicon. Next, the ground gate electrode 135 is deposited in the remaining trenches 125. The ground gate electrode 135 may be a metallic material formed of tungsten or cobalt, for example, and may be deposited by any suitable process such as by electro plating, electroless plating, CVD, the like, or combinations thereof. Subsequently, a planarization process such as a CMP process or a mechanical grinding process is performed, so that the portions of the glue layer 130, ground gate electrode 135, and possibly the dielectric layer 120 are removed and the upper surfaces leveled to one another. As a result, glue layer 130 and ground gate electrodes 135 are formed, which are collectively referred to as the ground gate 140.

Figure 4A:
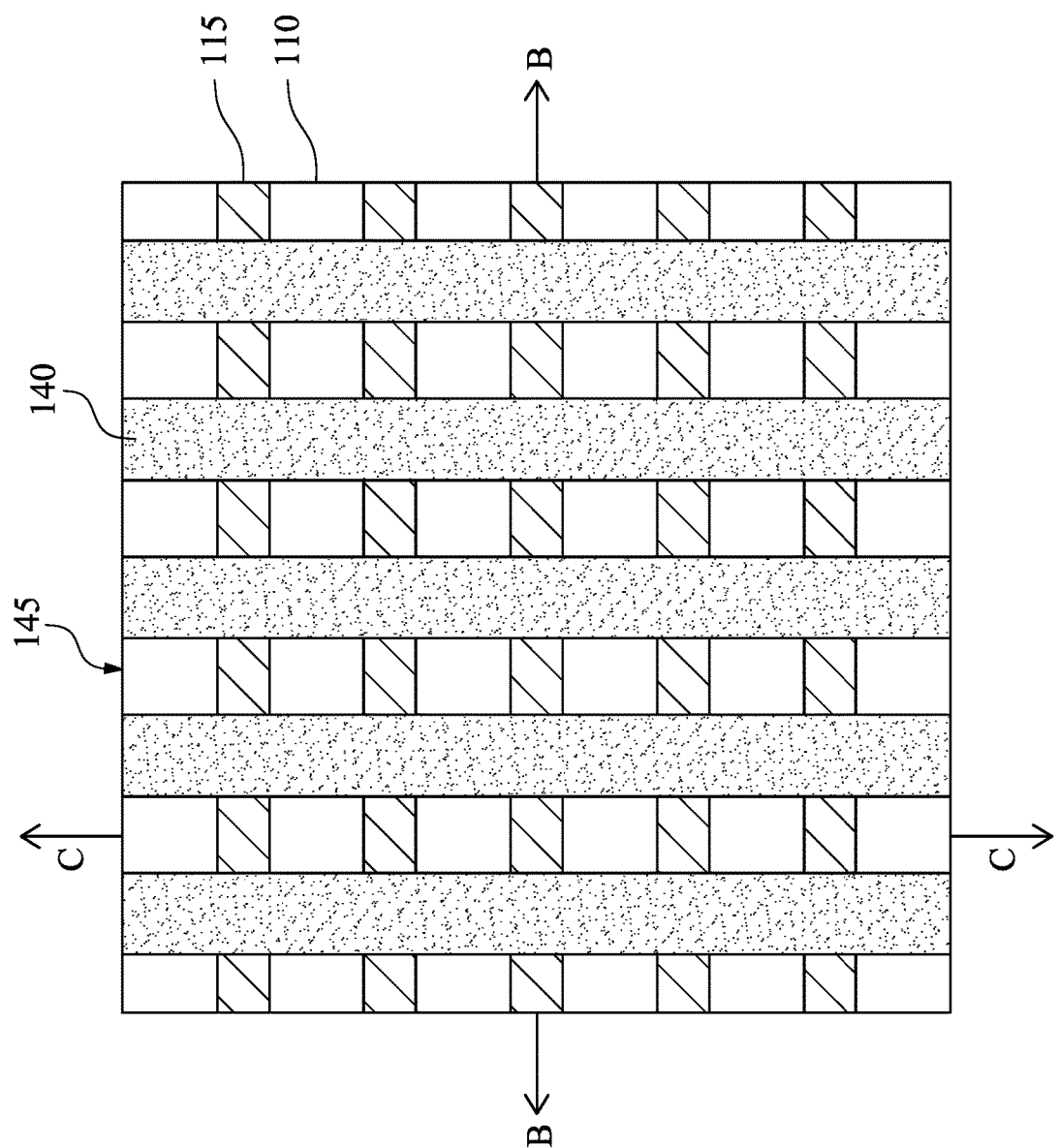
Figure 4B:
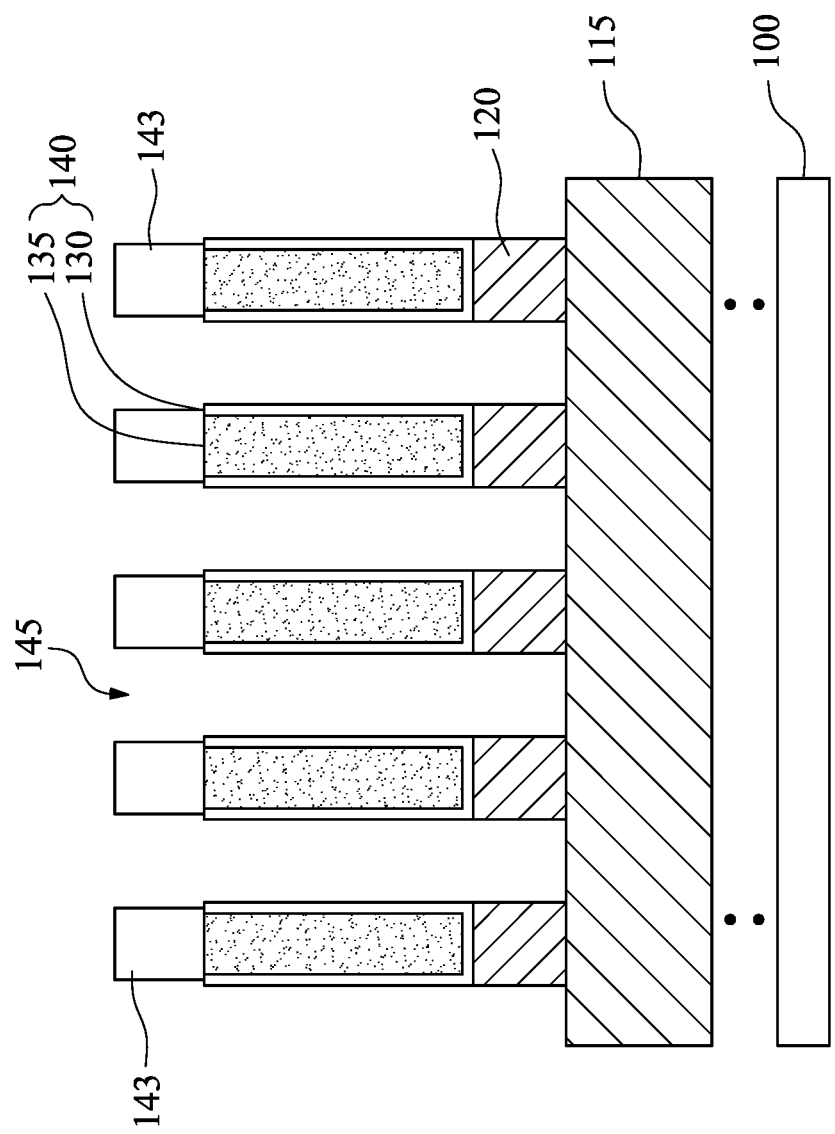
Figure 4C:
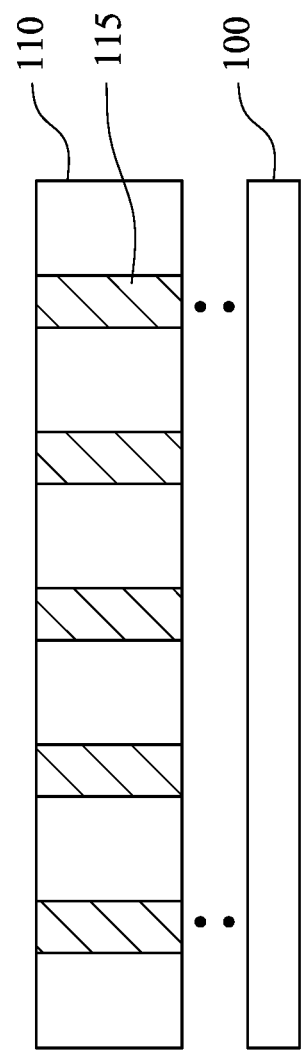

In FIGS. 4A, 4B, and 4C, trenches 145 are formed in the dielectric layer 120. FIG. 4A is in a plan view, FIG. 4B is a cross-sectional view along the line B-B of FIG. 4A, and FIG. 4C is a cross-sectional view along the line C-C of FIG. 4A. The view in FIG. 4A combines a view of the trenches 145, ground gates 140, and BLs 115. (The view in FIG. 4A omits the view of the photo resist 143.) The trenches 145 may be formed using any suitable photolithography and etching process. For example, a photo resist 143 may be deposited over the ground gates 140 and patterned to expose portions of the dielectric layers 120 between the ground gates 140. In some embodiments, etching the trenches 145 may use the ground gate 140 as part of the etch mask to perform a self-align etch of the trenches 145, such as illustrated in FIG. 4B with the patterned photo resist 143 exposing a portion of the ground gates 140. In other embodiments, the etching of the trenches 145 may use a wet etch or combination wet etch/dry etch to etch the dielectric layer 120 between the ground gates 140 so that all of the width of the dielectric layer 120 between the ground gate 140 are removed. In such cases, the patterned photo resist 143 may slightly overhang the width of the ground gates 140, such as illustrated in FIG. 4B right hand photo resist 143. The etching can use the BLs 115 and dielectric layer 110 as an etch stop so that the trenches 145 traverse completely through the dielectric layer 120 and expose the BLs 115 at the bottom and the ground gates 140 on the sides (glue layer 130).

Figure 5A:
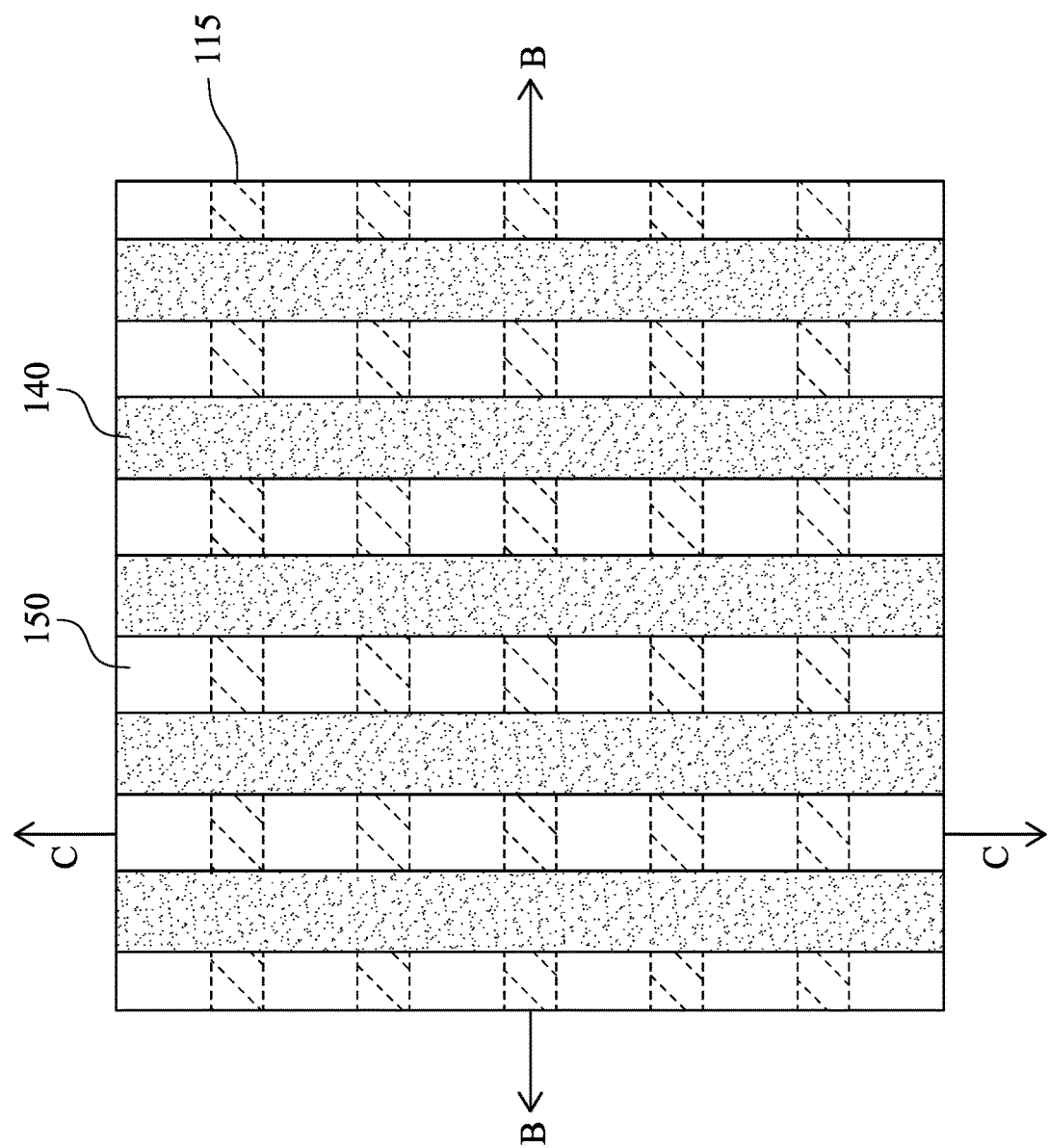
Figure 5B:
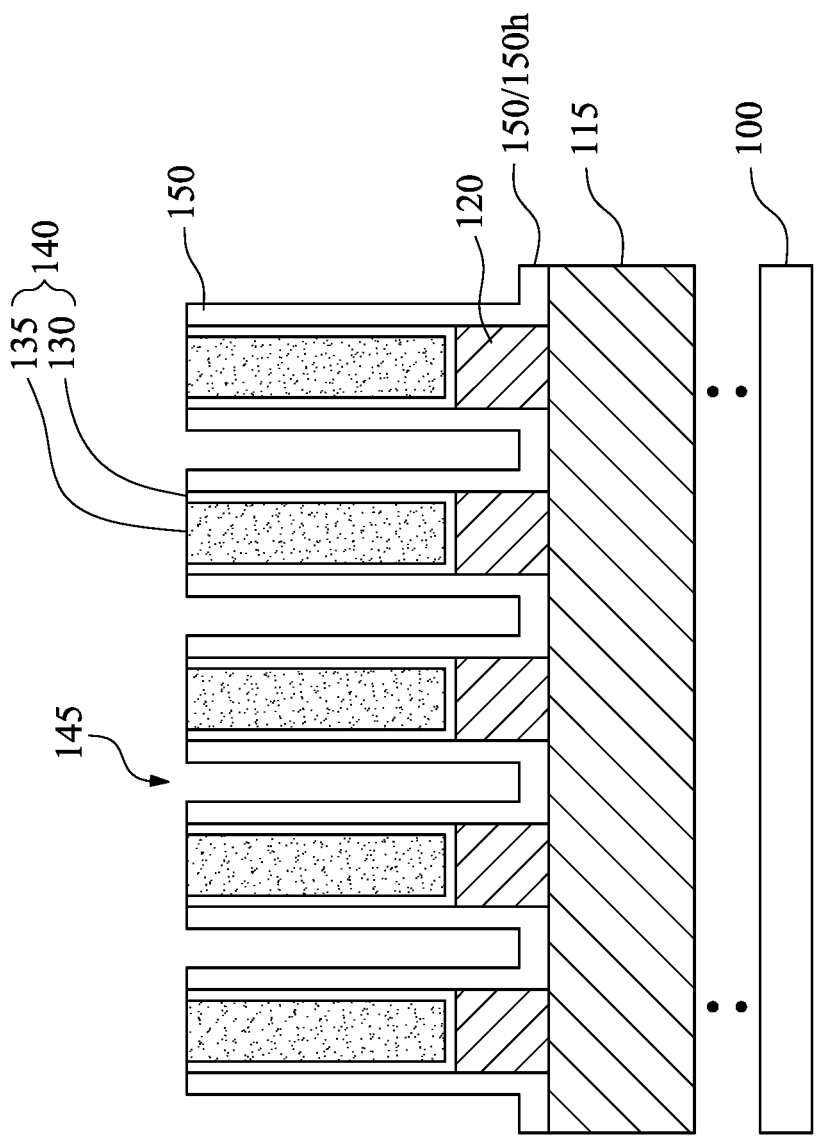
Figure 5C:
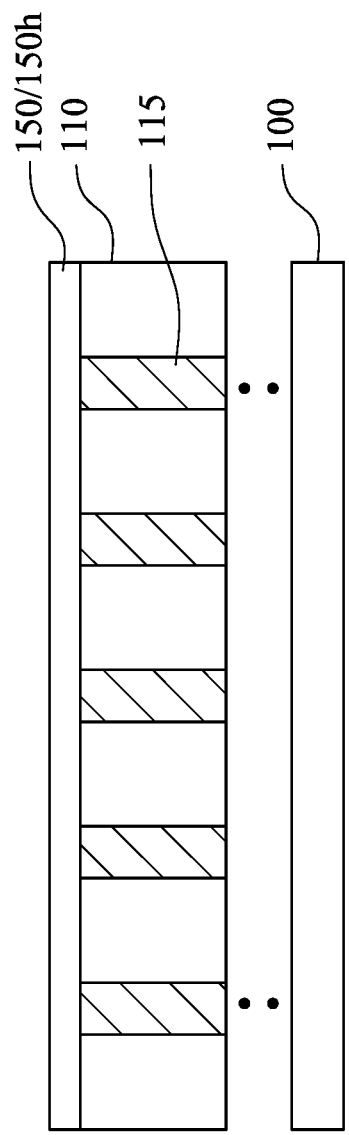

In FIGS. 5A, 5B, and 5C, a material for the channels 150 is deposited in the trenches 145. FIG. 5A is in a plan view, FIG. 5B is a cross-sectional view along the line B-B of FIG. 5A, and FIG. 5C is a cross-sectional view along the line C-C of FIG. 5A. The view in FIG. 5A combines a view of the material for the channels 150, ground gates 140, and BLs 115. (From the top down, the BLs 115 would not be visible and the channels 150 would look like vertical lines in between the ground gates 140). The material for the channel 150 may be deposited using any suitable process, such as by ALD, PVD, CVD, molecular beam epitaxy (MBE), the like, or combinations thereof. The resulting channels 150 may be conformally deposited (having a thickness on the bottom surface and side surfaces that vary by no more than about 25%) in the trenches 145 and over the ground gates 140. The material of the channels 150 may be silicon or an oxide of a semiconductor material, such as IGZO (indium gallium zinc oxide), IWO (indium tungsten oxide), IZO (indium zinc oxide), ITO (indium tin oxide), the like, or combinations thereof. The thickness of the channel is tunable. If the channel is too thin, then it will not be able to sustain a large enough current throughput. If the channel is too thick, then it is more likely that large current leakage would occur. In some embodiments, the channels 150 may be deposited to a thickness between about 1 nm and about 30 nm. After deposition a planarization process such as a CMP process may be used to remove the upper portions of the channels 150 over the ground gates 140.

Figure 6A:
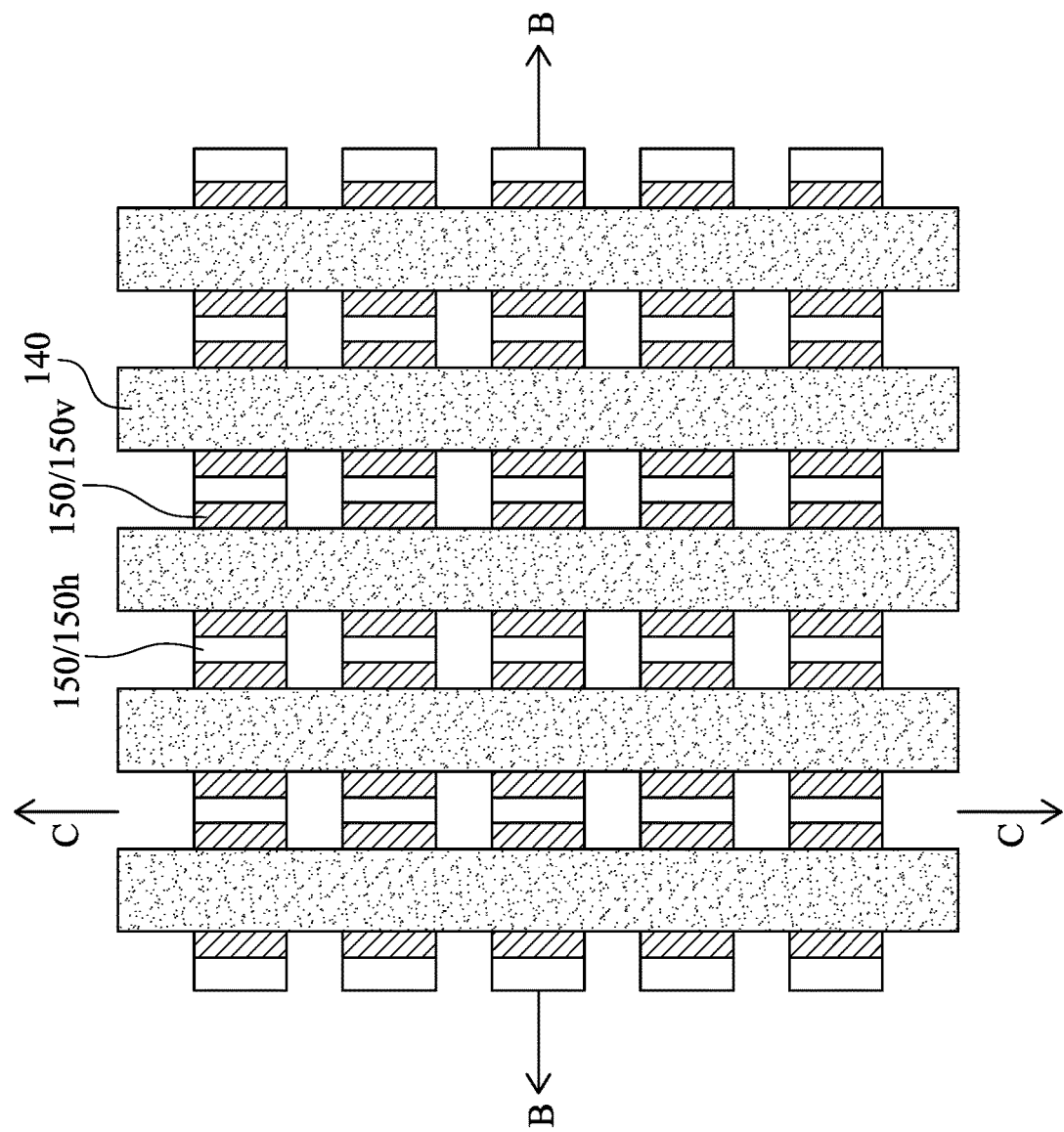
Figure 6B:
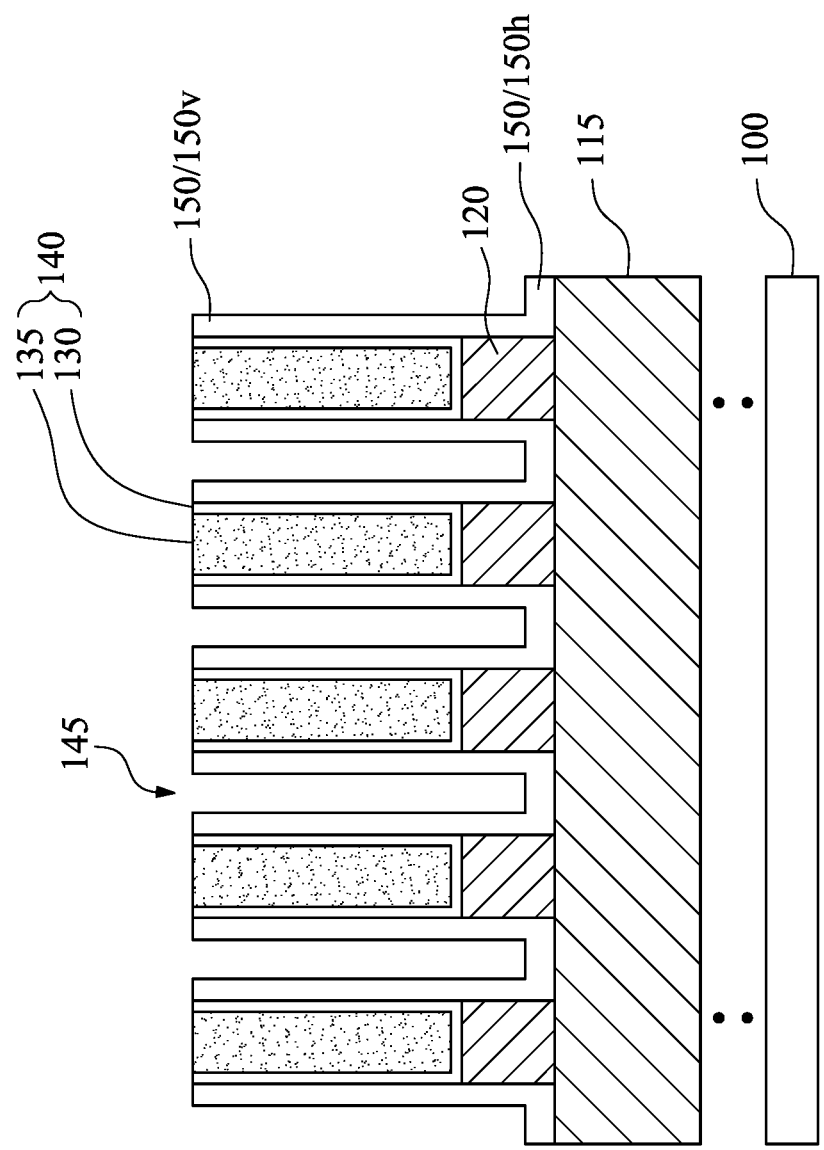
Figure 6C:
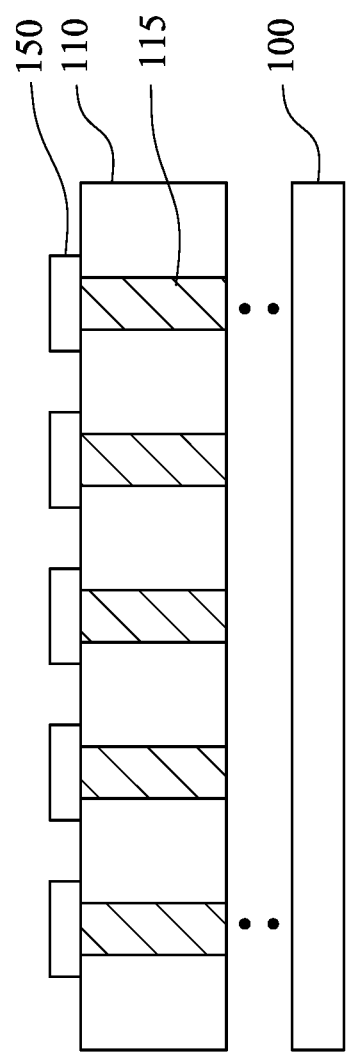

In FIGS. 6A, 6B, and 6C, the channels 150 are cut for the individual memory cells. FIG. 6A is in a plan view, FIG. 6B is a cross-sectional view along the line B-B of FIG. 6A, and FIG. 6C is a cross-sectional view along the line C-C of FIG. 6A. The view in FIG. 6A combines a view of the material for the channels 150 (illustrating the vertical legs 150v separately from the horizontal portion 150h) and ground gates 140. The channels 150 may be cut using any suitable process. In one embodiment, the channels 150 may be cut by a suitable photolithography and etching process, including depositing a photo mask (not shown), patterning the photo mask, and etching the exposed portions of the channels 150. The channels 150 are cut so that the portion of the channels 150 remaining run lengthwise perpendicular to the ground gates 140. After the channels 150 are cut, the remaining channels 150 are u-shaped channels 150 with vertical legs 150v separated by the ground gates 140. The horizontal portion 150h of the channels 150 are disposed directly on the BLs 115. As illustrated in FIG. 6C, the width of the channels 150 may be wider than the BLs 115 to overhang the BLs 115. Overhanging the channels 150 past the BLs 115 makes it so that all of the BLs 115 below the channels 150 are contacting a portion of the channels 150 and provides more channel material at the BLs 115 for current transfer through the channels 150.

Figure 7A:
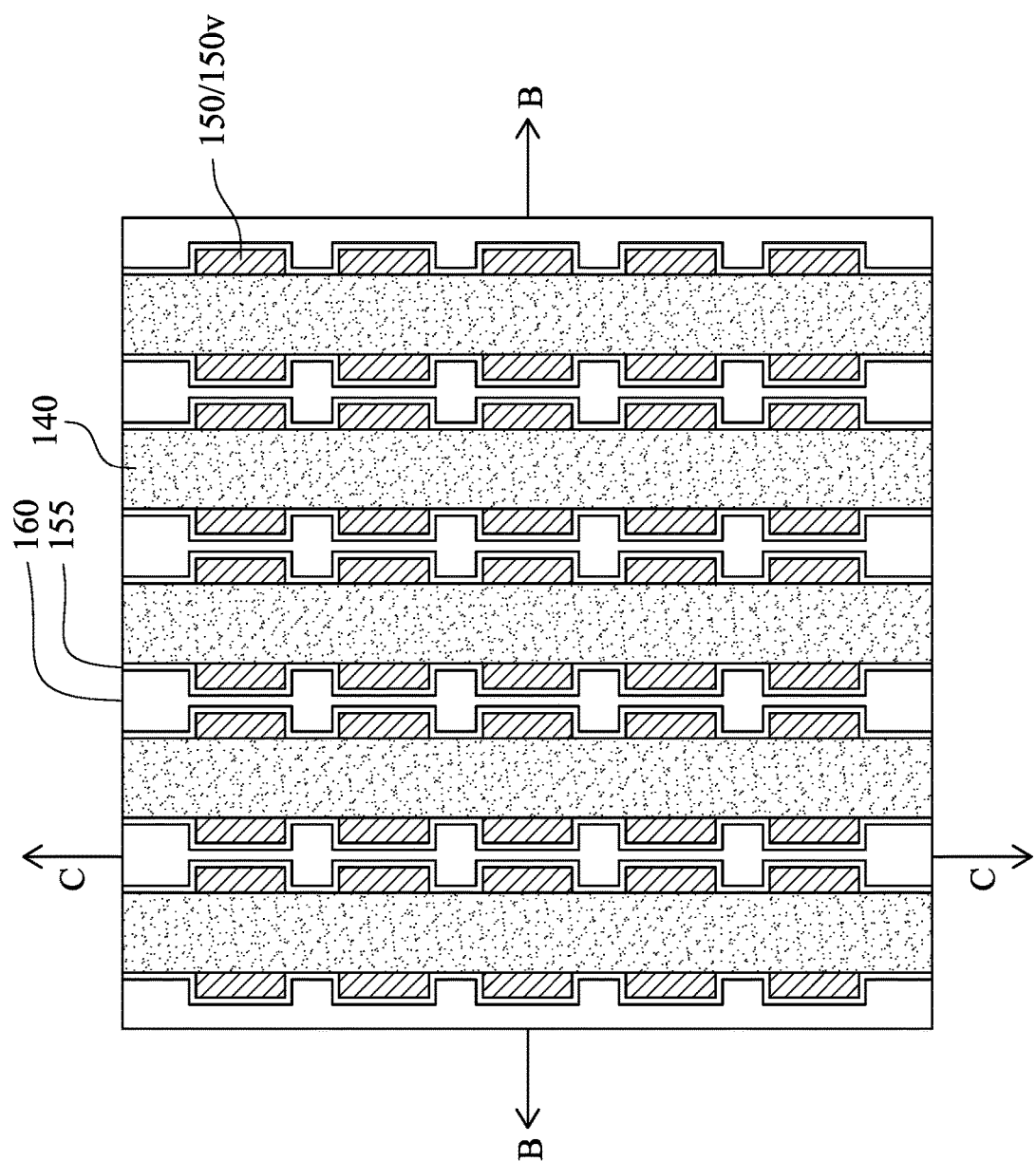
Figure 7B:
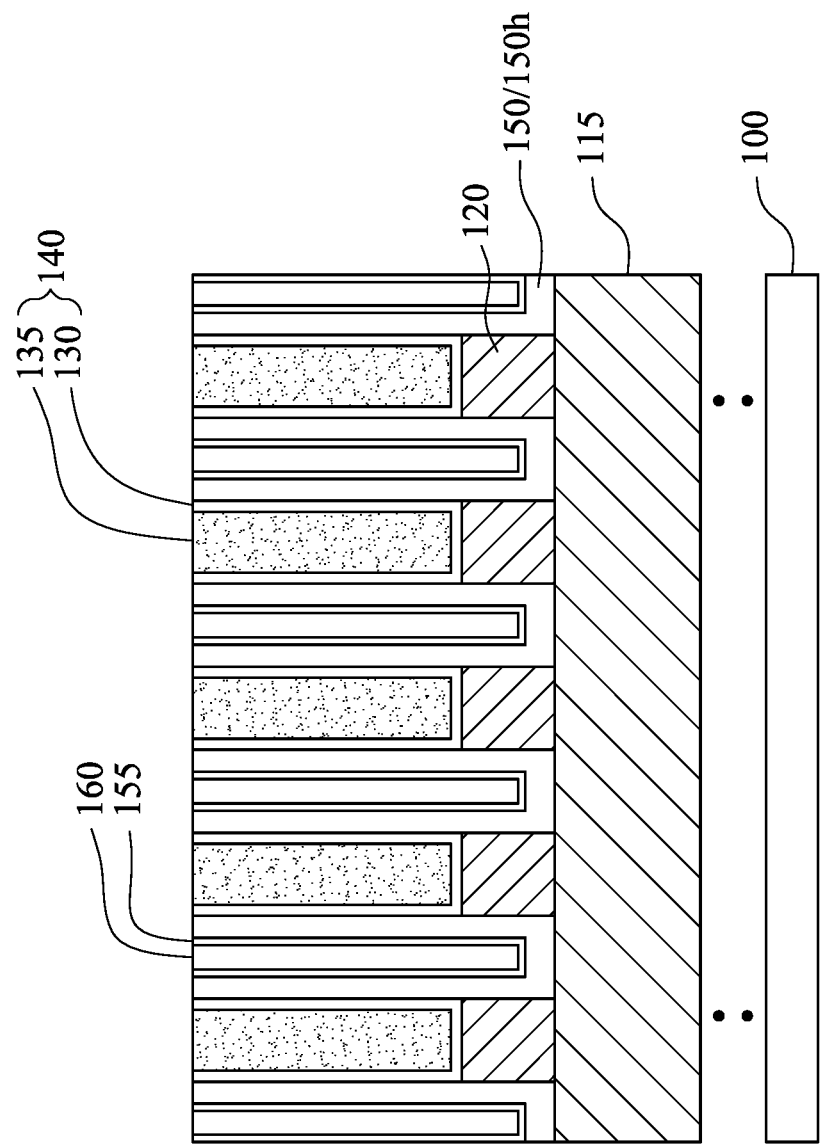
Figure 7C:
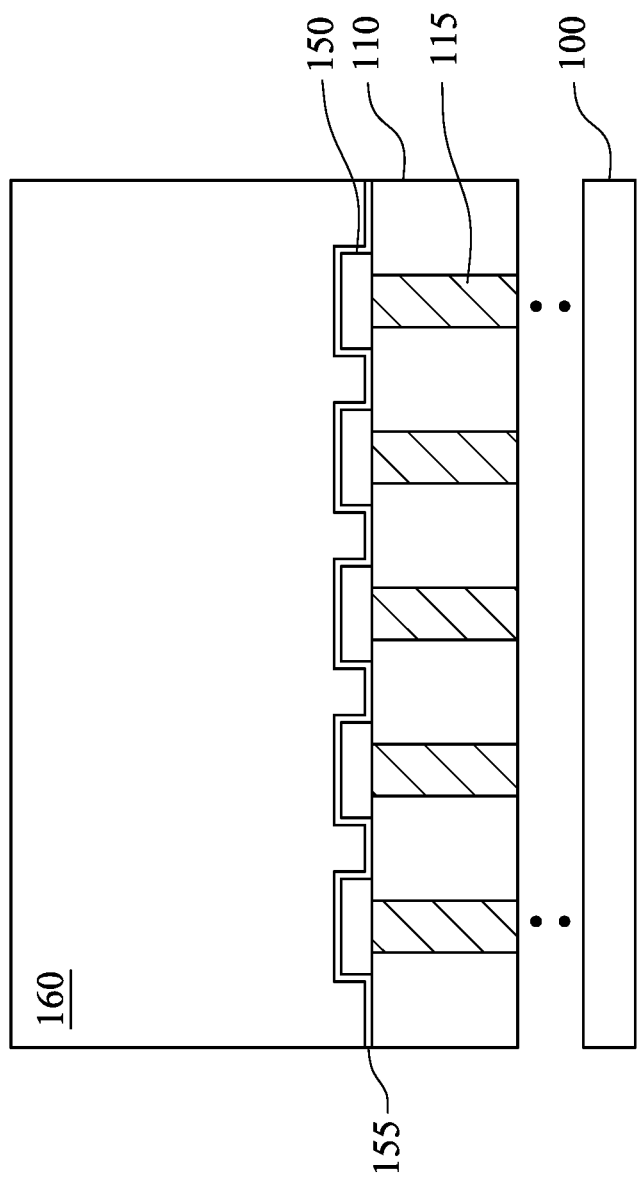

In FIGS. 7A, 7B, and 7C, a gate insulating layer and gate electrode are deposited over the channels 150, filling the openings 145. FIG. 7A is in a plan view, FIG. 7B is a cross-sectional view along the line B-B of FIG. 7A, and FIG. 7C is a cross-sectional view along the line C-C of FIG. 7A. The gate insulating layer 155 may be deposited conformally by any suitable technique, such as by CVD, ALD, the like, or combinations thereof. The gate insulating layer 155 is deposited over the channels 150 and lining the openings 145 between the cut channels 150. The gate insulating layer 155 may be any suitable material, such as a high-k dielectric layer. The dielectric constant (k-value) of the high-k dielectric material is higher than 3.9, and may be higher than about 7.0. In some embodiments, the high-k dielectric material of the gate insulating layer 155 may include aluminum oxide, tantalum oxide, STO (strontium titanate), BST (barium strontium titanate), titanium oxide, hafnium oxide, zirconium oxide, lanthanum oxide, praseodymium oxide, or the like. The gate insulating layer 155 may be deposited to a thickness between about 1 nm and about 100 nm.

Following deposition of the gate insulating layer 155, gate electrodes which are the WLs 160 are deposited in the remaining opening 145. The WLs 160 may be deposited by any suitable technique, such as by electroplating, electroless plating, CVD, PVD, ALD, the like, or combinations thereof. The WLs 160 may include one or more stacked conductive layers. Although the stacked layers are not shown separately, they may be distinguishable from each other. In some embodiments, the deposition of the stacked layers may be performed using conformal deposition techniques such as ALD or CVD, and may be built up of distinct layers of different materials, including work function metals and dielectrics. The work functions metals can include, for example, molybdenum, titanium nitride, tungsten, tantalum nitride, titanium aluminide, and ruthenium oxide, the like, or combinations thereof. The final layer of the WLs 160 may be a conductive fill deposited by a fill technique. The various layers can work together to set the electrical characteristics of the gate, such as the voltage threshold for enabling the gate to provide current flow through the channels 150.

After deposition of the gate insulating layer 155 and the WLs 160, the gate insulating layer 155 and WLs 160 may be planarized, such as by a CMP process, to remove excess portions of the gate insulating layer 155 and WLs 160 and level the upper surfaces of the ground gates 140, channels 150, gate insulating layer 155, and WLs 160.

Figure 8A:
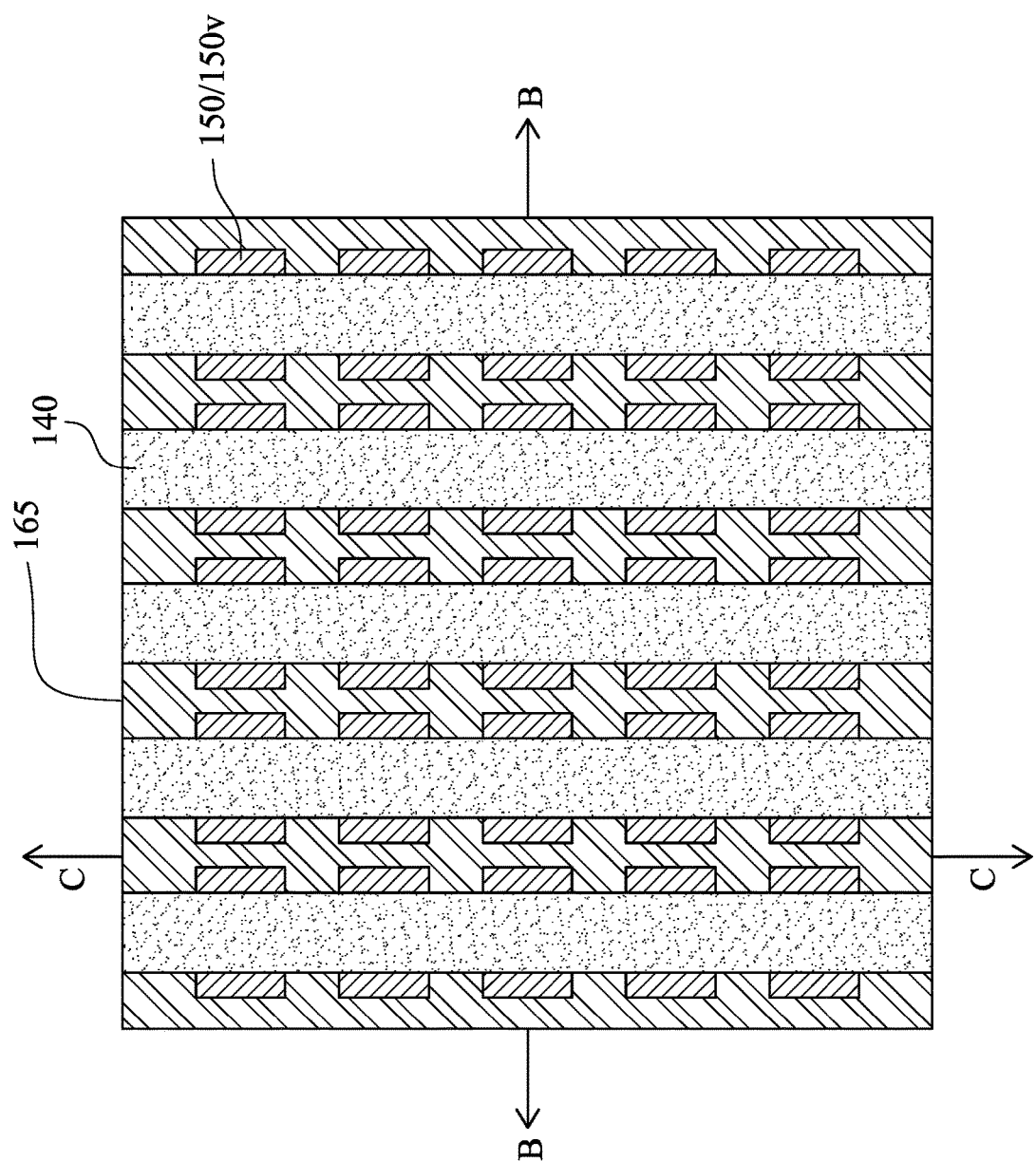
Figure 8B:
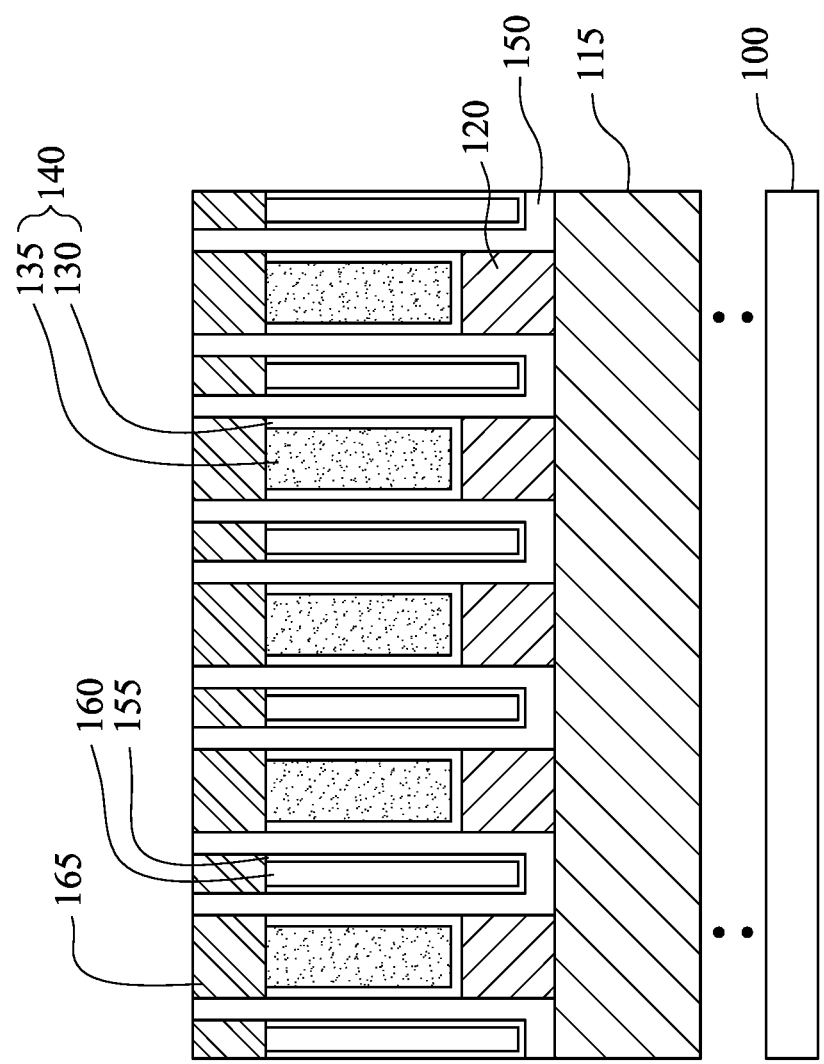
Figure 8C:
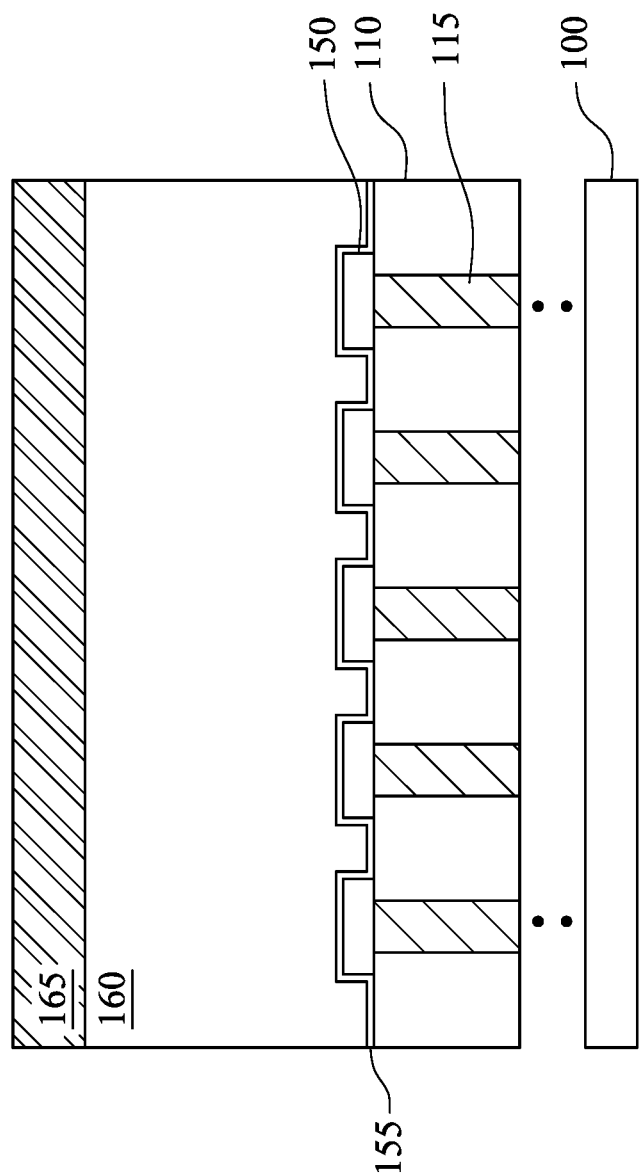

In FIGS. 8A, 8B, and 8C, the gate insulating layer 155, the WLs 160, and the ground gates 140 are recessed and an isolation layer 165 is deposited in the recesses. The isolation layer 165 provides isolation of a subsequently formed cell capacitor from the WLs 160 and the ground gates 140. FIG. 8A is in a plan view, FIG. 8B is a cross-sectional view along the line B-B of FIG. 8A, and FIG. 8C is a cross-sectional view along the line C-C of FIG. 8A. The plan view of FIG. 8A combines a view that includes the ground gates 140 which would not be visible from the top down. The recessing of the gate insulating layer 155, the WLs 160, and the ground gates 140 may be performed using suitable etchants for their respective materials. In some embodiments, the etching may be performed using a dry etching process, for example, using one or more suitable etching gasses. In other embodiments, the recessing of the gate insulating layer 155, the WLs 160, and the ground gates 140 may be performed using a wet etching process using one or more suitable etching chemicals or solutions. Although the upper surfaces of each of the ground gates 140, gate insulating layer 155, and WLs 160 are illustrated as being level with each other, the upper surfaces may have different heights, depending on the etch rates and etch conditions of the recessing process. In some embodiments, the gate insulating layer 155 may not be recessed.

Following recessing the ground gates 140, gate insulating layer 155, and WLs 160, the isolation layer 165 is deposited in the recesses. In some embodiments, prior to depositing the isolation layer 165, the exposed extended legs of the channel 150 may be doped with a suitable dopant. For example, the dopant may include phosphorous, antimony, bismuth, hydrogen, nitrogen, another suitable dopant, or combinations thereof. The dopant may be included in-situ during deposition of the channels 150 and/or the dopant may be implanted during a separate implantation process. The implantation process may utilize an angled implantation with an angle between 0° and 55°. Following implantation, the concentration levels of the dopant in the exposed extended legs of the channel 150 may be between $10^{16}$ atoms/cm$^3$ to about $10^{20}$ atoms/cm$^3$. In some embodiments, the doped concentration may have a decreasing gradient moving down the legs of the channel 150 (e.g., from the upper surfaces of the ground gates 140) toward the horizontal portion 150h of the channel. In some embodiments, the doped concentration of the horizontal portion 150h of the channel 150 may be less than the dopant concentration in the legs of the channel 150. Following the implantation, an anneal may be performed to repair the channel 150 and activate the dopants.

The isolation layer 165 may be deposited using any suitable technique, such as by CVD, PVD, the like, or combinations thereof. The isolation layer 165 may be made of any suitable isolating material, such as silicon nitride, silicon oxide, silicon oxynitride, silicon oxycarbide, silicon carbide, silicon carbonitride, silicon oxycarbonitride, the like, or combinations thereof. During deposition of the isolation layer 165, ambient hydrogen (e.g., H+ when used as a process gas) is deposited in the isolation layer 165. In subsequent processes, hydrogen can diffuse from the isolation layer 165 into the channel 150, combining with oxygen vacancies, thereby enhancing doping into the channel 150, improving channel conductivity by way of a resulting VO-H (oxygen vacancies trapping hydrogen) as a shallow donor (i.e., providing additional electrons). Following deposition of the isolation layer 165, a planarization process, such as a CMP process, may be performed to level the upper surfaces of the isolation layer 165 with the upper surfaces of the channel 150. The resulting thickness of the isolation layer 165 may be in a range of about 1 nm to about 100 nm.

Figure 9A:
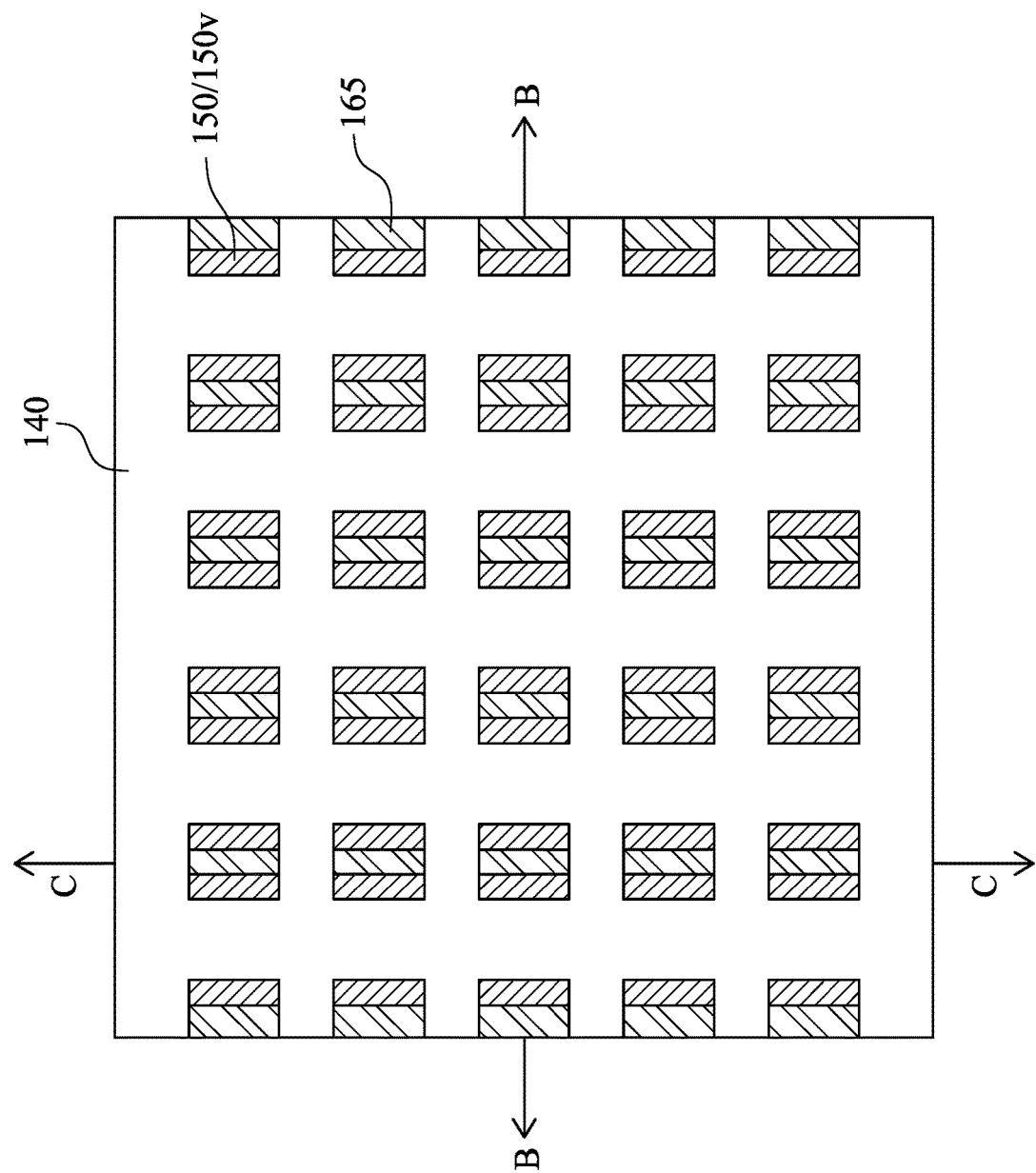
Figure 9B:
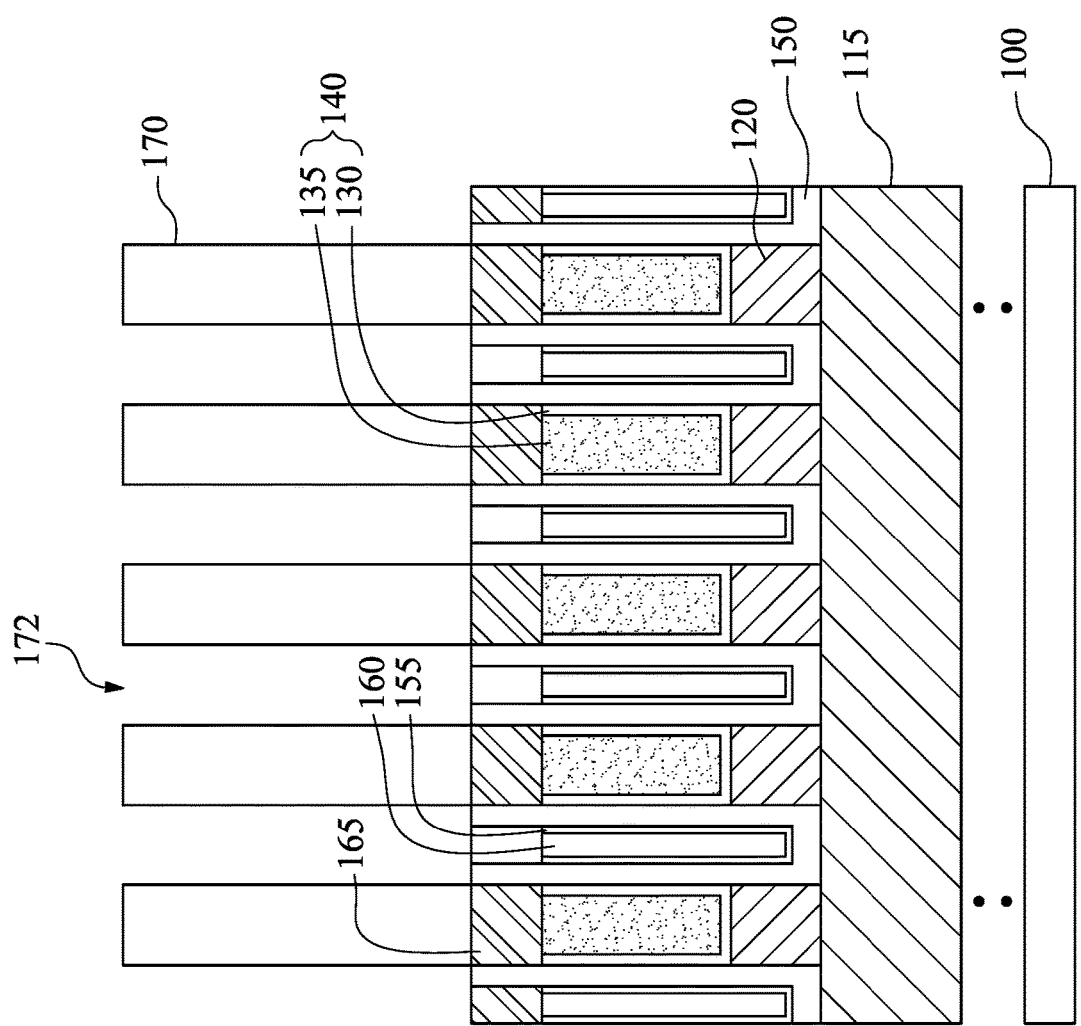
Figure 9C:
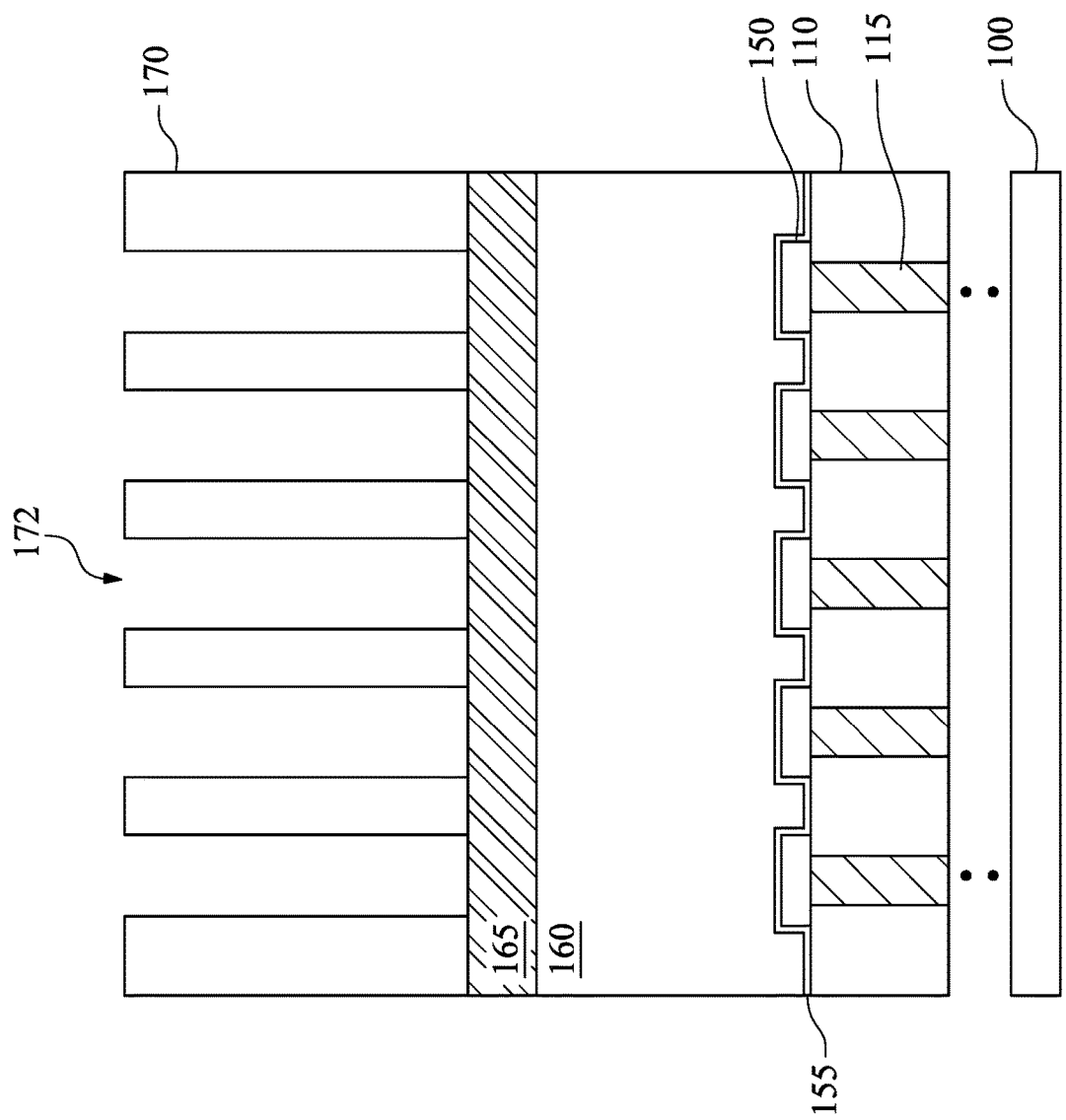

In FIGS. 9A, 9B, and 9C through 10A, 10B, and 10C, cell capacitors 190 are formed over each of the channels 150, in accordance with some embodiments. The cell capacitors 190 may be formed using other processes, resulting in alternative configurations, such as those illustrated in FIGS. 11A, 11B, 11C, and 11D through 13A, 13B, 13C and 13D. In FIGS. 9A, 9B, and 9C an insulating layer 170 is deposited over the isolation layer 165 and over the exposed upper surfaces of the channels 150. FIG. 9A is in a plan view, FIG. 9B is a cross-sectional view along the line B-B of FIG. 9A, and FIG. 9C is a cross-sectional view along the line C-C of FIG. 9A.

The insulating layer 170 may be made of any suitable insulating material, such as a dielectric material formed using, for example, FCVD, spin-on coating, CVD, or another deposition process. The insulating layer 170 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like.

After depositing the insulating layer 170, openings 172 may be formed in the insulating layer 170. As illustrated in FIGS. 9A, 9B, and 9C, the openings 172 expose upper surfaces of the side channels 150 for each of the cells. The openings 172 may be formed using any suitable process, such as by a photolithography and etching process, such as described above. Although the openings 172 are shown as having vertical sidewalls, the sidewalls may be tapered so that the widths at the tops of the openings 172 are larger than the widths at the bottom of the openings.

Figure 10A:
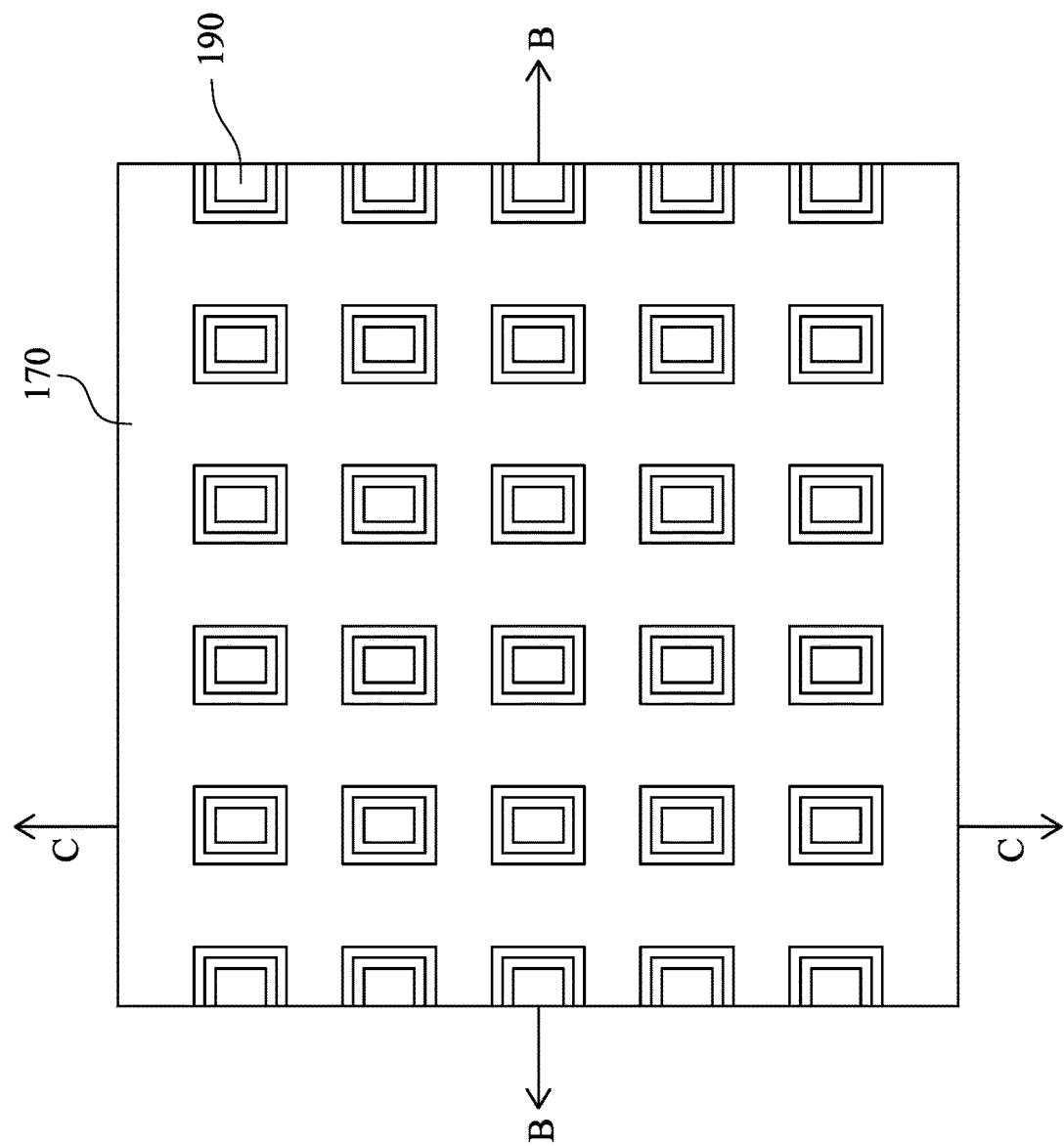
Figure 10B:
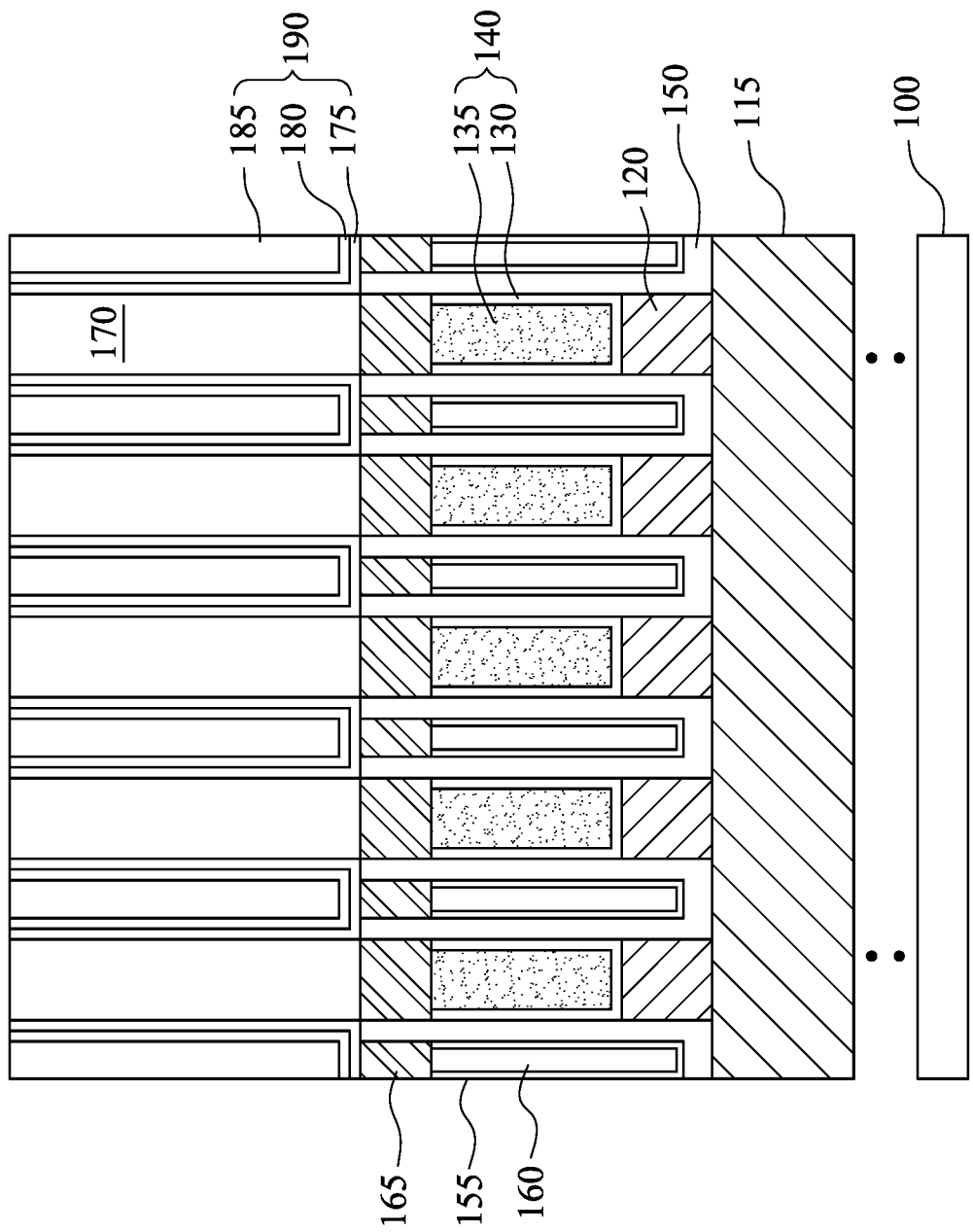
Figure 10C:
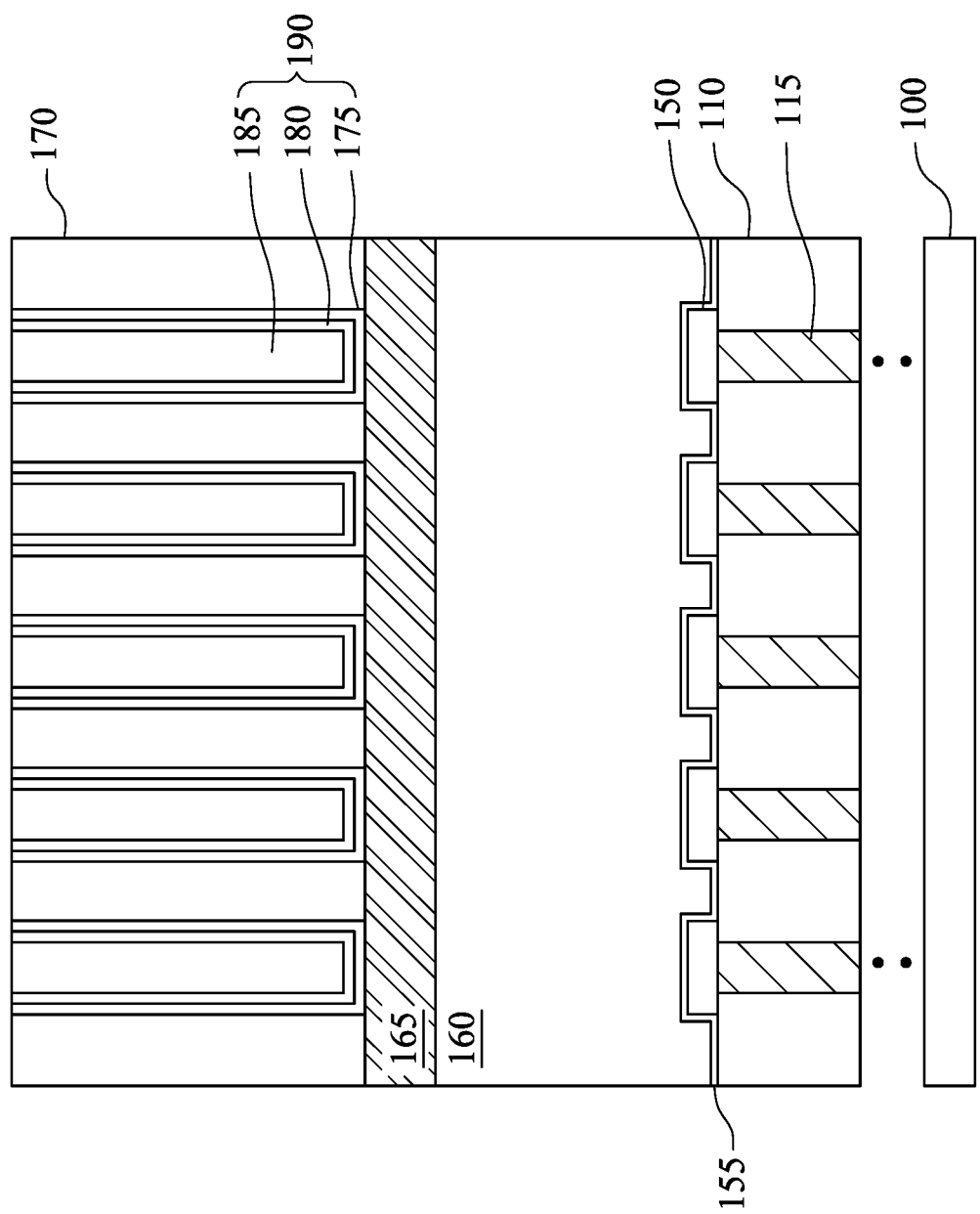

In FIGS. 10A, 10B, and 10C, metal-insulator-metal (MIM) cell capacitors 190 are formed in each of the openings 172. FIG. 10A is in a plan view, FIG. 10B is a cross-sectional view along the line B-B of FIG. 10A, and FIG. 10C is a cross-sectional view along the line C-C of FIG. 10A. The cell capacitors 190 may be formed by are formed by any suitable process. In one process, a series of conformal layers are deposited in the openings 172 by a conformal deposition process, such as by ALD or CVD, or the like. The first such conformal layer is a bottom electrode layer 175. Next, a capacitor dielectric layer 180 is deposited in the openings 172 on the bottom electrode layer 175. Finally, a top electrode 185 is deposited over the capacitor dielectric layer 180. The bottom electrode 175, the capacitor dielectric layer 180, and the top electrode 185, together are referred to as the cell capacitor 190.

The bottom electrode layer 175 may be made of any suitable conductive material, such as titanium, titanium nitride, tantalum, a tantalum nitride, or combinations thereof. The top electrode layer 185 may be made from any of the candidate materials as the bottom electrode 175, and may in some embodiments be made the same material as the bottom electrode 175. The capacitor dielectric layer 180 may include a nitride layer, a silicon nitride layer, or other dielectric material layers of high dielectric constant. In some embodiments, the capacitor dielectric layer 180 is a silicon nitride layer deposited by low-temperature CVD or plasma-enhanced CVD (PECVD) methods.

Following the formation of the top electrode layer 185, a planarization process may be used to remove excess materials from over the insulating layer 170. The planarization process also levels the upper surfaces of the top electrode layer 185, the capacitor dielectric layer 180, and the bottom electrode layer 175.

FIGS. 11A, 11B, 11C, and 11D through 13A, 13B, 13C, and 13D illustrate other processes and structures for forming the capacitors, in accordance with some embodiments. Each of the illustrated Figures in FIGS. 11A, 11B, 11C, and 11D through 13A, 13B, 13C, and 13D represents a partial cross-sectional view of the structure illustrated in FIG. 8B and additional processes on the structure illustrated in FIG. 8B to form the cell capacitors 190, which are metal-insulator-metal (MIM) capacitors for each of the memory cells. Unless otherwise specified, like references refer to like elements, which may be formed in like manner using like materials.

Figure 11A:
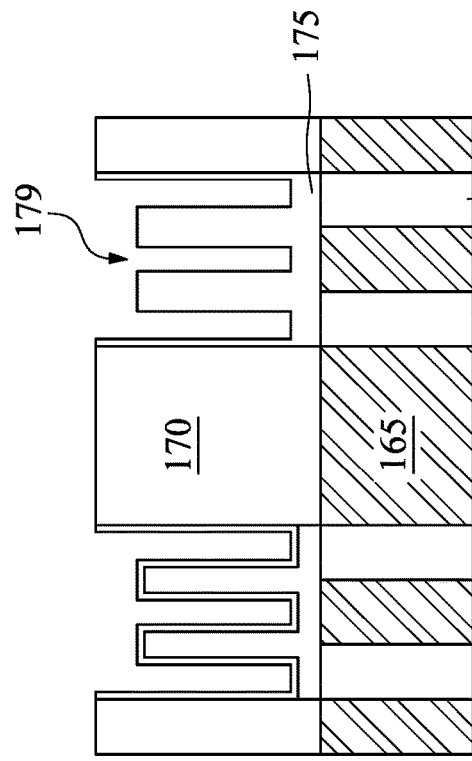
FIGS. 11A, 11B, 11C, and 11D are continued processes based on the structure illustrated in FIG. 8B, in accordance with other embodiments.

FIGS. 11A, 11B, 11C, and 11D illustrate intermediate steps in the formation of a double MIM capacitor structure. The double MIM structure has the advantage of providing a larger capacitance in a similar space requirement than the cell capacitors 190 described in FIGS. 10A, 10B, and 10C. In FIG. 11A the insulating layer 170 is formed over the isolation layer 165 and channels 150. The insulating layer 170 may be formed using processes and materials similar to those described above with respect to FIGS. 9A, 9B, and 9C. Next openings are formed in the insulating layer 170 similar to the openings 172, described above. Then, the bottom electrode layer 175 of the cell capacitors 190 is formed in the openings. The bottom electrode layer 175 may be made of any suitable conductive material, such as titanium, titanium nitride, tantalum, a tantalum nitride, or combinations thereof using any suitable process such as by spin coat, FVCD, the like or combinations thereof.

As illustrated in FIG. 11A, the bottom electrode layer 175 may extend above the upper surface of the insulating layer 170, or in some embodiments, may be planarized to the upper surface of the insulating layer 170. A photo resist is then deposited over the insulating layer 170 and the bottom electrode layer 175 and patterned to form a photo mask 177. The photo resist material of the photo mask 177 may be formed using any suitable organic photo resist material and may be deposited, for example, by spin coat, FCVD, the like, or combinations thereof.

Figure 11C:
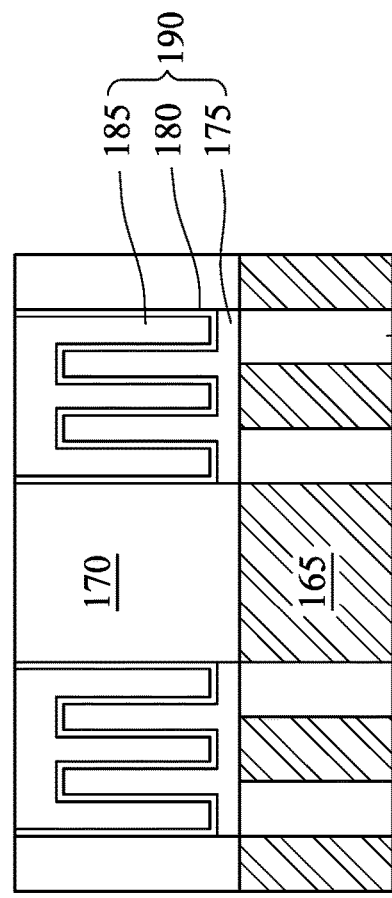
Figure 11B:
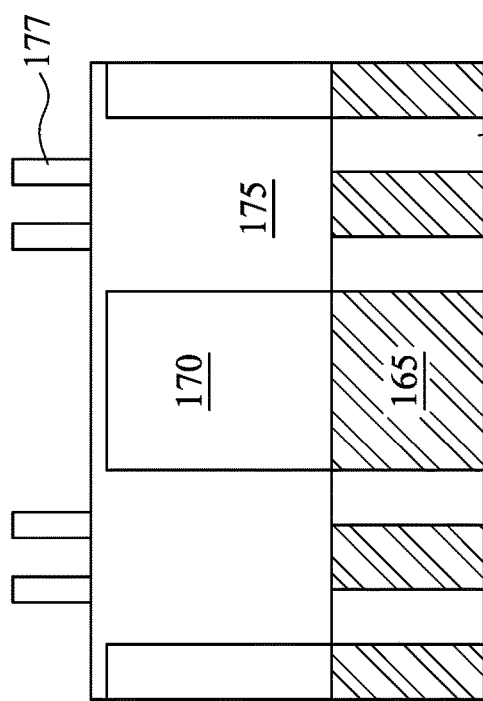

In FIG. 11B, the photomask 177 is used as a mask to etch openings 179 in the bottom electrode layer 175, leaving pillars 175p of the bottom electrode layer 175 and a bottom portion of the bottom electrode layer 175 remaining in the openings 172. The etching can be performed using any suitable etching process, using a suitable etchant selective to the material of the bottom electrode layer 175. In some embodiments, a dry etch process may be used to etch the bottom electrode layer 175. In the process of etching the openings 179, the photo mask 177 may be consumed and the upper surfaces of the pillars 175p recessed below the upper surface of the insulating layer 170. If the photo mask 177 is not consumed by the etching, the photo mask 177 may be removed by an ashing process and the patterned bottom electrode layer 175 etched as a whole to recess the upper surfaces of the pillars 175p to be below the upper surface of the insulating layer 170.

The pillars 175p may be made using other processes, such as by using a electroplating or electroless plating process to deposit the bottom horizontal portion of the bottom electrode 175. Then a mask material may be formed in the opening 172, and patterned with two openings corresponding to the pillars 175p, which may then be formed by electroplating or by electroless plating. The mask may then be removed, resulting in the structure of FIG. 11B.

In FIG. 11C, the capacitor dielectric layer 180 is formed over the bottom electrode layer 175, including over the pillars 175p. The capacitor dielectric layer 180 may include a nitride layer, a silicon nitride layer, or other dielectric material layers of high dielectric constant. In some embodiments, the capacitor dielectric layer 180 is a silicon nitride layer deposited by low-temperature CVD or plasma-enhanced CVD (PECVD) methods. As illustrated, in some embodiments, the capacitor dielectric layer 180 may extend vertically along sidewalls of the insulating layer 170 in the openings 179.

Figure 11D:
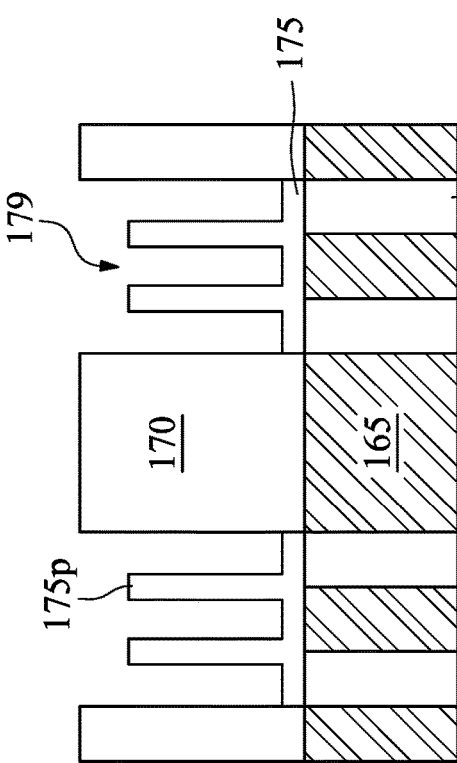

In FIG. 11D, the top electrode layer 185 is formed in the remaining openings 179 and may extend laterally over the insulating layer 170. The top electrode layer 185 may be made of any suitable conductive material, such as titanium, titanium nitride, tantalum, a tantalum nitride, or combinations thereof using any suitable process such as by spin coat, FVCD, the like or combinations thereof. After deposition, the top electrode layer 185 may extend above and laterally over the upper surfaces of the insulating layer 170. A planarization process may be used to level the upper surfaces of the top electrode layer 185 with the upper surfaces of the insulating layer 170.

Figure 12C:
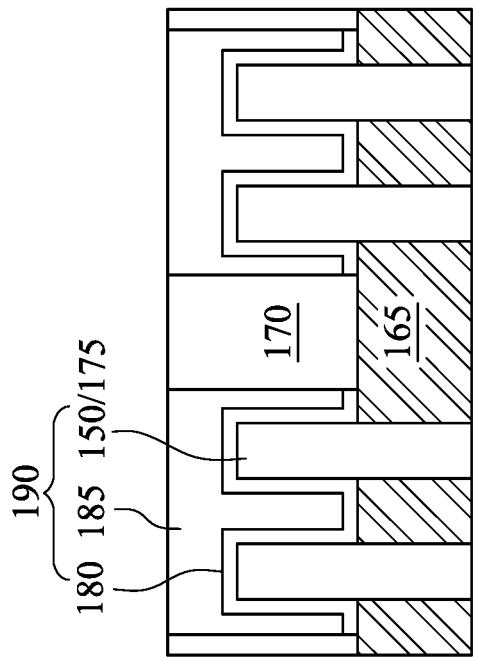
FIGS. 12A, 12B, and 12C are continued processes based on the structure illustrated in FIG. 8B, in accordance with other embodiments.
Figure 12A:
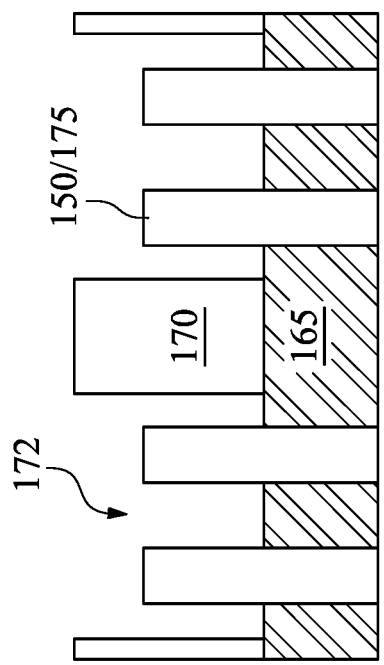
Figure 12B:
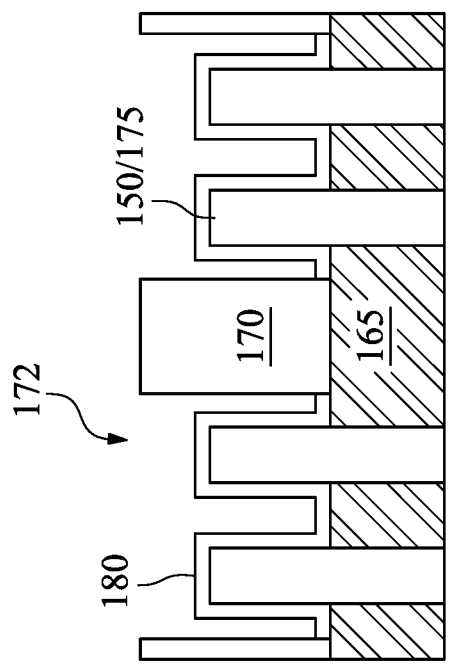

FIGS. 12A, 12B, and 12C illustrate intermediate steps in the formation of MIM cell capacitors 190 in accordance with other embodiments. The cell capacitors 190 of FIGS. 12A, 12B, and 12C use a portion of the channels 150 as the bottom electrode layer 175, reducing complexity and size of the structure, leading to greater production efficiencies. In FIG. 12A, prior to forming the insulating layer 170, the isolation layer 165 is recessed to expose vertical projections of the channels 150. The isolation layer 165 may be recessed using an etch back process to recess the isolation layer 165. Then, the insulating layer 170 may be deposited and patterned, using processes and materials similar to those discussed above with respect to FIGS. 9A, 9B, and 9C. In FIG. 12B, the capacitor dielectric layer 180 is deposited over the channels 150. The capacitor dielectric layer 180 may (e.g., similar to FIG. 11C) or may not (as illustrated) extend vertically along the sidewalls of the insulating layer 170. In FIG. 12C, the top electrode layer 185 is formed over the capacitor dielectric layer 180 and planarized, thereby forming the cell capacitors 190.

FIGS. 13A, 13B, 13C, and 13D illustrate intermediate steps in the formation of MIM cell capacitors 190 in accordance with other embodiments. The cell capacitors 190 of FIGS. 13A, 13B, 13C, and 13D use a portion of the channels 150 to help shape the cell capacitors 190. In FIG. 13A, prior to forming the insulating layer 170, the isolation layer 165 is recessed to expose vertical projections of the channels 150. The isolation layer 165 may be recessed using an etch back process to recess the isolation layer 165.

In FIG. 13B, the bottom electrode layer 175 may be deposited in the openings 172 and over the channels 150. The bottom electrode layer 175 may be formed using a conformal deposition process, such as ALD, CVD, the like, or combinations thereof. In some embodiments a plating process, such as an electroplating process or electroless plating process may be used, utilizing the channels 150 as seed layers for the plating process.

In FIG. 13C the capacitor dielectric layer 180 may be deposited over the bottom electrode layer 175. Finally, in FIG. 13D the top electrode layer 185 is deposited and the device is planarized to form the memory cells 190.

Figure 14A:
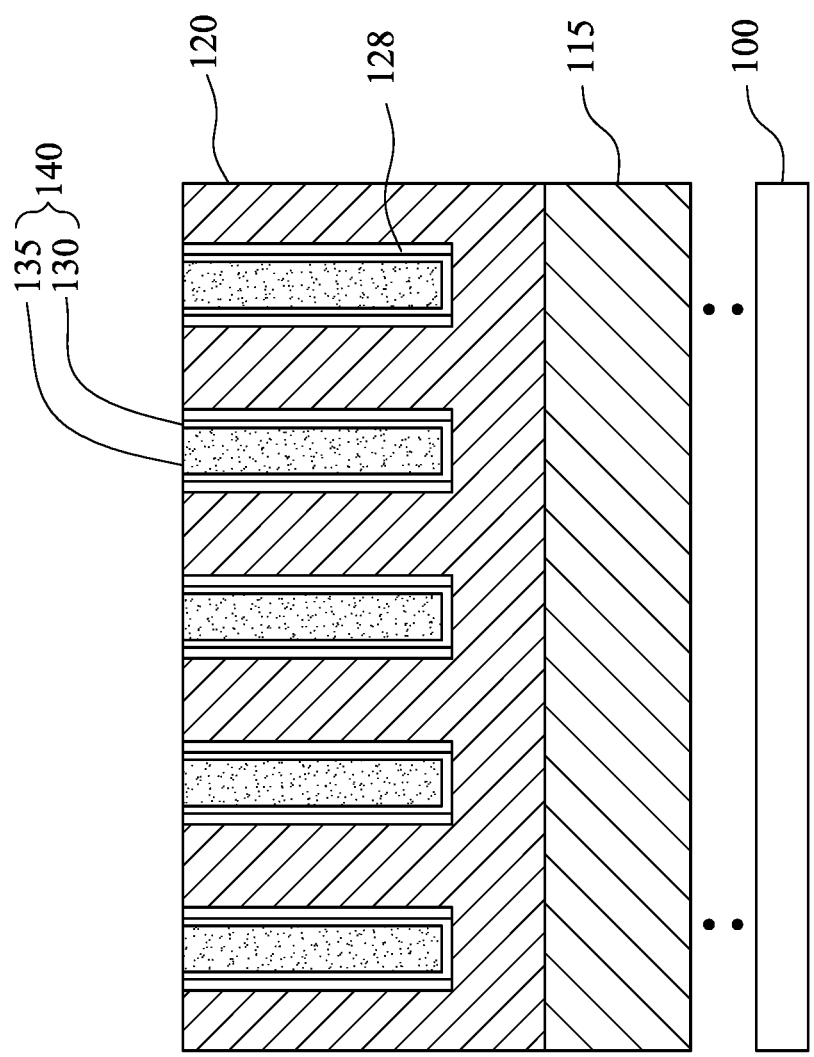
FIGS. 14A and 14B illustrate cross-sectional views of the formation of the ground gates, in accordance with some embodiments.
Figure 14B:
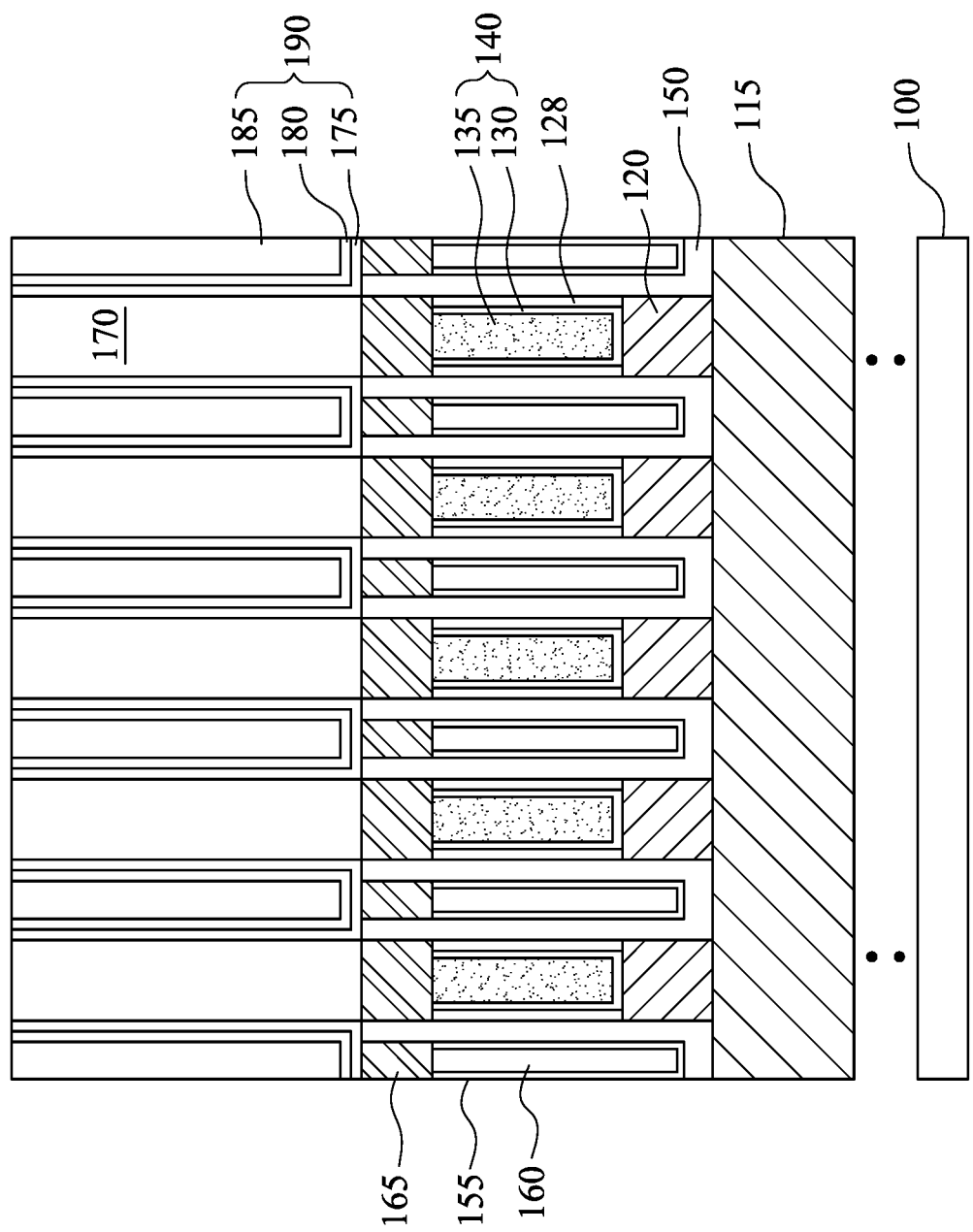

FIGS. 14A and 14B illustrate cross-sectional views of the formation of the ground gates 140 which are laterally surrounded by a dielectric layer 128, which is also interposed between the ground gates 140 and the to be formed channels 150, in accordance with some embodiments. Including a dielectric layer 128 provides improved reduction in WL coupling by providing a further channel insulating layer between the channels 150 and the ground gates 140. In FIG. 14A, the dielectric layer 128 is conformally deposited in the openings 125 and over the dielectric layer 120 of the structure depicted in FIG. 2B. The dielectric layer 128 can include any suitable dielectric material, such as a high-k dielectric material, such as any of the candidate materials discussed above with respect to the gate insulating layer 155, and may be deposited using processes similar to those discussed above with respect to the gate insulating layer 155. Following deposition of the dielectric layer 128, in some embodiments, the horizontal portions of the dielectric layer 128 may be removed by an anisotropic etch, such as illustrated in FIG. 14A. In other embodiments, the horizontal portions of the dielectric layer 128 may remain at the bottoms of the openings 125 (under the subsequently formed ground gates 140. The flow as described above can continue with the dielectric layer 128, except that the dielectric layer 128 is also be recessed prior to forming the isolation layer 165.

In FIG. 14B, the structure of FIG. 10B is illustrated, except that it includes the dielectric layer 128. As illustrated in FIG. 14B, the dielectric layer 128 is interposed between the channels 150 and the ground gate 140, and extends vertically from the isolation layer 165 to the dielectric layer 120.

Additional processes may be performed so that the memory cells are functional in a memory device. For example, an inter-dielectric material may be formed over the memory cells 190 of FIGS. 10C, 11D, 12C, 13D, or 14B. Openings may be formed in the inter-dielectric material, and the top electrode layer 185 may be coupled by a via formed in the openings to a reference voltage, such as ground. The ground gates 140 may be coupled to the same reference voltage as the top electrode layers 185 (e.g., ground). The WLs 160 may be coupled to word line input/outputs of the memory device and the BLs 115 may be coupled to bit line input/outputs of the memory device.

Embodiments have several advantages. By utilizing vertical channels, with the gate disposed there between and a ground gate disposed between adjacent memory cells, the resulting memory cells have reduced or eliminated body effect and reduced or eliminated WL coupling. With reduced body effect the threshold voltage for each of the cells 190 is less likely to be significantly impacted, resulting in better controllability of the gate by the WLs 160. Further, because the channels are on the sides, rather than inner portion of each memory cell 190, future design capability is improved since the width is not limited by design, which would impact restore time of the memory cells 190.

One embodiment is a semiconductor structure including a dielectric layer disposed over a substrate. The semiconductor structure also includes a gate electrode embedded in the dielectric layer. The semiconductor structure also includes a channel layer wrapping the gate electrode a conductive structure adjacent to the channel layer, the channel layer interposed between the gate electrode and the conductive structure. The semiconductor structure also includes a dielectric structure disposed over the conductive structure and the gate electrode, the channel layer extending up through the dielectric structure. In an embodiment, the semiconductor structure further includes: a cell capacitor disposed over and coupled to the channel layer. In an embodiment, the cell capacitor includes: a bottom electrode, a capacitor dielectric layer disposed over the bottom electrode, and a top electrode disposed on the capacitor dielectric layer. In an embodiment, an upper portion of the channel layer is free from the dielectric structure, where the bottom electrode of the cell capacitor includes the upper portion of the channel layer, the capacitor dielectric layer extending along sidewalls and an upper surface of the upper portion of the channel layer. In an embodiment, the semiconductor structure further includes: a channel insulating layer interposed between the channel layer and the conductive structure. In an embodiment, the semiconductor structure further includes: a conductive line embedded in the substrate, the channel layer coupled to the conductive line. In an embodiment, an interface between the channel layer and the conductive line is laterally surrounded by the dielectric layer. In an embodiment, the channel layer overlaps the conductive line.

Another embodiment is a method including forming a conductive line in a substrate. The method also includes depositing an insulating layer over the substrate. The method also includes patterning a first opening in the insulating layer, the first opening extending perpendicular to the conductive line. The method also includes forming a conductive structure in the first opening. The method also includes patterning a second opening in the insulating layer, the second opening exposing a sidewall of the conductive structure and the conductive line. The method also includes depositing a channel layer in the second opening. The method also includes depositing a gate dielectric layer over the channel layer. The method also includes depositing a gate electrode over the gate dielectric layer. The method also includes recessing the gate dielectric layer, the gate electrode, and the conductive structure, the channel layer extending above the gate electrode. The method also includes depositing an isolation structure surrounding the channel layer, the isolation structure having an upper surface level with an upper surface of the channel layer. In an embodiment, after forming the conductive structure, a portion of the insulating layer remains between the conductive structure and the substrate. In an embodiment, forming the conductive structure includes: depositing a glue layer in the first opening; and filling the first opening with a metallic fill material. In an embodiment, forming the conductive structure further includes: depositing a dielectric layer in the first opening prior to depositing the glue layer. In an embodiment, the method further includes: depositing an insulating structure over the isolation structure; and forming a cell capacitor in the insulating structure, the cell capacitor coupled to the channel layer. In an embodiment, forming the cell capacitor includes: depositing an capacitor insulator material over the first upper portion of the channel layer, and depositing an upper electrode over the capacitor insulator material.

Another embodiment is a method including depositing a transistor channel structure in a first opening, the first opening disposed between two conductive structures, the transistor channel structure lining the first opening, a bottom of the transistor channel structure extending along a conductive element embedded in a substrate, where a first isolation structure is interposed between the two conductive structures and the substrate, the first opening exposing a portion of the first isolation structure. The method also includes depositing a gate dielectric layer in the first opening, the gate dielectric layer lining the first opening on the transistor channel structure. The method also includes depositing a gate electrode in the first opening, the gate electrode filling the first opening. The method also includes recessing upper surfaces of the two conductive structures and an upper surface of the gate electrode, a first portion of the transistor channel structure exposed from the two conductive structures and the gate electrode. The method also includes depositing a second isolation structure over the upper surfaces of the two conductive structures and the upper surface of the gate electrode, the second isolation structure laterally surrounding the first portion of the transistor channel structure. In an embodiment, a third isolation structure surrounds each of the two conductive structures such that the third isolation structure is interposed between each of the two conductive structures and the transistor channel structure. In an embodiment, recessing the second isolation structure exposes a second portion of the transistor channel structure; depositing a capacitor insulating layer of a capacitor over the second portion of the transistor channel structure; and depositing an upper electrode of the capacitor over the capacitor insulating layer. In an embodiment, the method further includes: depositing a bottom electrode of the capacitor over the second portion of the transistor channel structure prior to depositing the capacitor insulating layer. In an embodiment, the method further includes: forming a cell capacitor over the transistor channel structure, a bottom electrode of the cell capacitor contacting each of two upper surfaces of the transistor channel structure. In an embodiment, the method further includes: coupling the conductive element to a bit line of a memory device; coupling the gate electrode to a word line of the memory device; and coupling the two conductive structures to a same reference voltage of the memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a conductive line in a substrate;
   depositing an insulating layer over the substrate;
   patterning a first opening in the insulating layer, the first opening extending perpendicular to the conductive line;
   forming a conductive structure in the first opening;
   patterning a second opening in the insulating layer, the second opening exposing a sidewall of the conductive structure and the conductive line;
   depositing a channel layer in the second opening;
   depositing a gate dielectric layer over the channel layer;
   depositing a gate electrode over the gate dielectric layer;
   recessing the gate dielectric layer, the gate electrode, and the conductive structure, the channel layer extending above the gate electrode; and
   depositing an isolation structure surrounding the channel layer, the isolation structure having an upper surface level with an upper surface of the channel layer.

2. The method of claim 1, wherein, after forming the conductive structure, a portion of the insulating layer remains between the conductive structure and the substrate.

3. The method of claim 1, wherein forming the conductive structure comprises:
   depositing a glue layer in the first opening; and
   filling the first opening with a metallic fill material.

4. The method of claim 3, wherein forming the conductive structure further comprises:
   depositing a dielectric layer in the first opening prior to depositing the glue layer.

5. The method of claim 1, further comprising:
   depositing an insulating structure over the isolation structure; and
   forming a cell capacitor in the insulating structure, the cell capacitor coupled to the channel layer.

6. The method of claim 5, further comprising:
   prior to forming the insulating structure, recessing an upper surface of the isolation structure to expose a first upper portion of the channel layer, wherein forming the cell capacitor comprises:
   depositing a capacitor insulator material over the first upper portion of the channel layer, and
   depositing an upper electrode over the capacitor insulator material.

7. A method comprising:
   depositing a transistor channel structure in a first opening, the first opening disposed between two conductive structures, the transistor channel structure lining the first opening, a bottom of the transistor channel structure extending along a conductive element embedded in a substrate, wherein a first isolation structure is interposed between the two conductive structures and the substrate, the first opening exposing a portion of the first isolation structure;
   depositing a gate dielectric layer in the first opening, the gate dielectric layer lining the first opening on the transistor channel structure;
   depositing a gate electrode in the first opening, the gate electrode filling the first opening;
   recessing upper surfaces of the two conductive structures and an upper surface of the gate electrode, a first portion of the transistor channel structure exposed from the two conductive structures and the gate electrode; and
   depositing a second isolation structure over the upper surfaces of the two conductive structures and the upper surface of the gate electrode, the second isolation structure laterally surrounding the first portion of the transistor channel structure.

8. The method of claim 7, wherein a third isolation structure surrounds each of the two conductive structures such that the third isolation structure is interposed between each of the two conductive structures and the transistor channel structure.

9. The method of claim 7, further comprising:
recessing the second isolation structure, wherein recessing the second isolation structure exposes a second portion of the transistor channel structure;
depositing a capacitor insulating layer of a capacitor over the second portion of the transistor channel structure; and
depositing an upper electrode of the capacitor over the capacitor insulating layer.

10. The method of claim 9, further comprising:
depositing a bottom electrode of the capacitor over the second portion of the transistor channel structure prior to depositing the capacitor insulating layer.

11. The method of claim 7, further comprising:
forming a cell capacitor over the transistor channel structure, a bottom electrode of the cell capacitor contacting each of two upper surfaces of the transistor channel structure.

12. The method of claim 7, further comprising:
coupling the conductive element to a bit line of a memory device;
coupling the gate electrode to a word line of the memory device; and
coupling the two conductive structures to a same reference voltage of the memory device.

13. A method of forming a memory device, the method comprising:
forming a bit line in a first dielectric layer;
forming a second dielectric layer over the bit line and the first dielectric layer;
forming a U-shaped channel on the bit line, the U-shaped channel extending through the second dielectric layer, the U-shaped channel having two vertical legs and a horizontal leg connecting the two vertical legs;
forming a first gate in the U-shaped channel between the two vertical legs of the U-shaped channel and over the horizontal leg; and
forming a cell capacitor over and coupled to the U-shaped channel.

14. The method of claim 13, further comprising:
forming a second gate over the second dielectric layer, wherein a first vertical leg of the two vertical legs is between the second gate and the first gate.

15. The method of claim 14, wherein the second gate is a ground gate.

16. The method of claim 14, further comprising:
recessing the first gate below an upper surface of the U-shaped channel.

17. The method of claim 16, further comprising:
forming an isolation layer over the first gate, wherein an upper surface of the isolation layer is level with the upper surface of the U-shaped channel.

18. The method of claim 17, wherein the isolation layer extends over the second gate.

19. The method of claim 13, further comprising:
forming a third dielectric layer over the first gate, wherein forming the cell capacitor comprises:
forming an opening in the third dielectric layer; and
forming the cell capacitor in the opening in the third dielectric layer, wherein a bottom electrode of the cell capacitor has a U-shape.

20. The method of claim 13, wherein the cell capacitor is coupled to both of the two vertical legs of the U-shaped channel.

* * * * *